United States Patent [19]

Ai et al.

[11] Patent Number: 4,767,797

[45] Date of Patent: Aug. 30, 1988

[54] PHOTOCURABLE COMPOSITIONS OF POLY(ETHYNYLPHENYL)ACETYLENE, ITS COPOLYMER AND COMPOSITION THEREOF

[75] Inventors: Hideo Ai; Yohsuke Koizumi; Naohiro Tsuruta, all of Fuji, Japan

[73] Assignee: Asahi Kasei Kogyo Kabushiki Kaisha, Japan

[21] Appl. No.: 899,650

[22] Filed: Aug. 25, 1986

Related U.S. Application Data

[62] Division of Ser. No. 621,362, Jun. 15, 1984, abandoned.

[30] Foreign Application Priority Data

Jun. 20, 1983 [JP] Japan .................. 58-109321
Aug. 29, 1983 [JP] Japan .................. 58-157428
Oct. 19, 1983 [JP] Japan .................. 58-194351

[51] Int. Cl.$^4$ .................. C08F 2/50; C08F 281/00
[52] U.S. Cl. .................. 522/8; 522/25; 522/37; 522/40; 522/43; 522/44; 522/50; 522/54; 522/65; 522/26; 522/48; 522/53; 522/66; 522/110; 522/79; 522/125; 522/124; 522/111; 522/117; 522/119; 522/121; 522/34; 522/120; 522/114; 522/158; 525/202; 525/275; 525/288; 525/353
[58] Field of Search ............ 522/110, 158, 14, 8, 522/25, 37, 40, 43, 44, 50, 54, 26, 65, 48, 53, 66, 79, 125, 124, 111, 117, 119, 121, 34, 120, 114; 526/285, 297

[56] References Cited

U.S. PATENT DOCUMENTS

| | | | |
|---|---|---|---|
| 3,169,868 | 2/1965 | Borden | 522/158 |
| 3,300,456 | 1/1967 | Hay | 526/285 |
| 3,882,073 | 5/1975 | Cessna | 526/285 |
| 3,993,711 | 11/1976 | Watson | 526/285 |
| 4,020,265 | 4/1977 | White | 526/285 |
| 4,026,859 | 5/1977 | Cessna | 526/285 |
| 4,070,333 | 1/1978 | Jabloner | 526/285 |
| 4,097,460 | 6/1978 | Jabloner | 526/285 |
| 4,098,767 | 7/1978 | Bilow | 526/285 |
| 4,562,141 | 12/1985 | Tieke | 526/285 |
| 4,667,006 | 5/1987 | Ai et al. | 526/285 |

OTHER PUBLICATIONS

Masuda, Macromolecules, vol. 7, No. 6, 1974 pp. 728–731.
Masuda, Macromolecules, vol. 9, No. 4, 1976 pp. 661–667.
Masuda, Polymer Bulletin, vol. 2, 1980, pp. 823–827.
Masuda, Polymer, vol. 23, 1982 pp. 1663–1666.

Primary Examiner—John C. Bleutge
Assistant Examiner—A. H. Koeckert
Attorney, Agent, or Firm—Finnegan, Henderson, Farabow, Garrett & Dunner

[57] ABSTRACT

A linear polymer having a recurring unit represented by the formula (I):

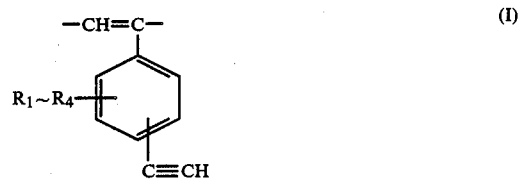

wherein
$R_1$, $R_2$, $R_3$ and $R_4$ each independently is a hydrogen atom, a $C_{1-10}$ alkyl group, a $C_{6-10}$ cycloalkyl group, an aryl group, or a halogen atom and the ethynyl group is in either meta position or para position to the main polymer chain;

and a weight-average molecular weight of 1,000 to 1,000,000. A resin composition consisting essentially of (i) a polymer having a recurring unit represented by the formula (I) or a polymer having a recurring unit represented by the formula (I) and a recurring unit represented by the formula (II):

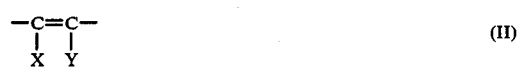

wherein X and Y each independently is a $C_{6-20}$ aryl (Abstract continued on next page.)

group, a $C_{1-10}$ alkyl group, a $C_{6-10}$ cycloalkyl group, a silyl group having a $C_{1-10}$ alkyl group or a $C_{6-10}$ aryl group, a hydrogen atom or a halogen atom, and the ethynyl group of the unit (I) is in either meta position or para position to the main polymer chain; and the weight ratio of the unit (I) to the unit (II) ranges from 1/99 to 99.5/0.5 and (ii) at least one agent selected from the group consisting of (a) an improvement agent for casting and molding property in an amount of about 3 to about 50% by weight based on the weight of the polymer; (b) an adhesive agent in an amount of about 1 to about 15% by weight based on the weight of the polymer; and (c) a photocrosslinking initiator in an amount of about 0.1 to about 20% by weight based on the weight of the polymer.

29 Claims, 5 Drawing Sheets

PHOTOCURABLE COMPOSITIONS OF POLY(ETHYNYLPHENYL)ACETYLENE, ITS COPOLYMER AND COMPOSITION THEREOF

This is a division of application Ser. No. 621,362, filed June 15, 1984, now abandoned.

BACKGROUND OF THE INVENTION

1. Field of the Invention

This invention relates to novel poly(ethynylphenyl)acetylene, its copolymers and compositions thereof which are useful as electron-beam resist, photosensitive resin, and heat-resistant resins.

2. Description of the Prior Art

Branching polyphenylene compounds which contain an ethynyl group linked with an aromatic ring are disclosed in U.S. Pat. Nos. 3,882,073 and 4,070,333. However, due to the use of a catalyst which can cause cyclotrimerization of the ethynyl group in the polymerization, the main chain of the polymer cannot be constructed by a conjugated double bond. Further, these polymers have a drawback that the use is limited.

It has been described in Macromolecules, Vol. 7, p. 728 (1974) and ibid, Vol. 8, p. 717 (1975) that tungsten hexachloride and molybdenum pentachloride can be employed as a catalyst for polymerization of a substituted acetylene. Further, it has been described in Macromolecules, Vol. 9, p. 661 (1976) that both tungsten hexachloride and molybdenum pentachloride show higher activities when they are employed with a little water or reducing agents such as tetraphenyltin. In Polym. Bull., Vo. 2, p. 828 (1980) and Polymer, Vol. 23, p. 1663 (1982), it has been described that active catalyst for polymerization of a substituted acetylene can be obtained by irradiating light from a high-pressure mercury lamp to tungsten hexacarbonyl or molybdenum hexacarbonyl in the presence of a halogenated hydrocarbon. It has been suggested by the authors of the above-described publications that these catalysts may make a metal carbene complex in the beginning of the reaction by reacting with a monomer, that is, a substituted acetylene, under reduction condition, and the metal carbene complex may act as a catalyst for polymerizing the substituted acetylene.

However, these catalysts have never been used for polymerizing an aromatic disubstituted acetylene such as diethynylbenzene. In fact, these catalysts are not useful to obtain the polymers of this invention because when these catalysts are employed, a micro gel having a three-dimensional cross-linked structure is produced, and linear polymers are hardly obtained.

Ziegler-Natta catalysts which are well known polymerization catalysts of acetylene are also not useful for polymerizing the aromatic disubstituted acetylene for the same reasons as described above. It is recognized that cross linking reaction occurs together with the polymerization of the substituted acetylene when these known catalysts are employed. Actually, nobody have reported that Ziegler-Natta catalysts can be employed for polymerizing the aromatic disubstituted acetylene.

SUMMARY OF THE INVENTION

The object of this invention is to provide poly(ethynylphenyl)acetylene, its copolymers and compositions thereof which are useful as electron-beam resists, photosensitive resins, and heat-resistant resins.

Another object of this invention is to provide methods for preparing the poly(ethynylphenyl)acetylene and the copolymer.

Further object of this invention is to provide poly(ethynylphenyl)acetylene compositions and the copolymer compositions each having an improved molding and coating property, a higher adhesive property to silicone wafer or glass, or an improved photocrosslinking property under light having the wave length of 300 to 500 nm.

Namely, this invention relates to (i) a linear polymer having a recurring unit represented by the formula (I):

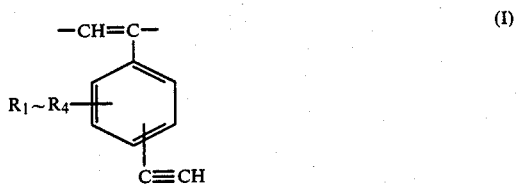

wherein
$R_1$, $R_2$, $R_3$ and $R_4$ each independently is a hydrogen atom, a $C_{1-10}$ alkyl group, a $C_{6-10}$ cycloalkyl group, an aryl group, or a halogen atom and the ethynyl group is in either meta position or para position to the main polymer chain;
and a weight-average molecular weight 1,000 to 1,000,000, and (ii) a linear copolymer having a weight-average molecular weight of 1,000 to 1,000,000 consisting of a recurring unit represented by the formula (I) and a recurring unit represented by the formula (II):

wherein
X and Y each independently is a $C_{6-20}$ aryl group, a $C_{1-10}$ alkyl group, a $C_{6-10}$ cycloalkyl group, a silyl group having a $C_{1-10}$ alkyl group or a $C_{6-10}$ aryl group, a hydrogen atom or a halogen atom, and the ethynyl group of the unit (I) is in either meta position or para position to the main polymer chain;
and the weight ratio of the unit (I) to the unit (II) ranges from 1/99 to 99.5/0.5.

DETAILED DESCRIPTION OF THE INVENTION

Figure 1:
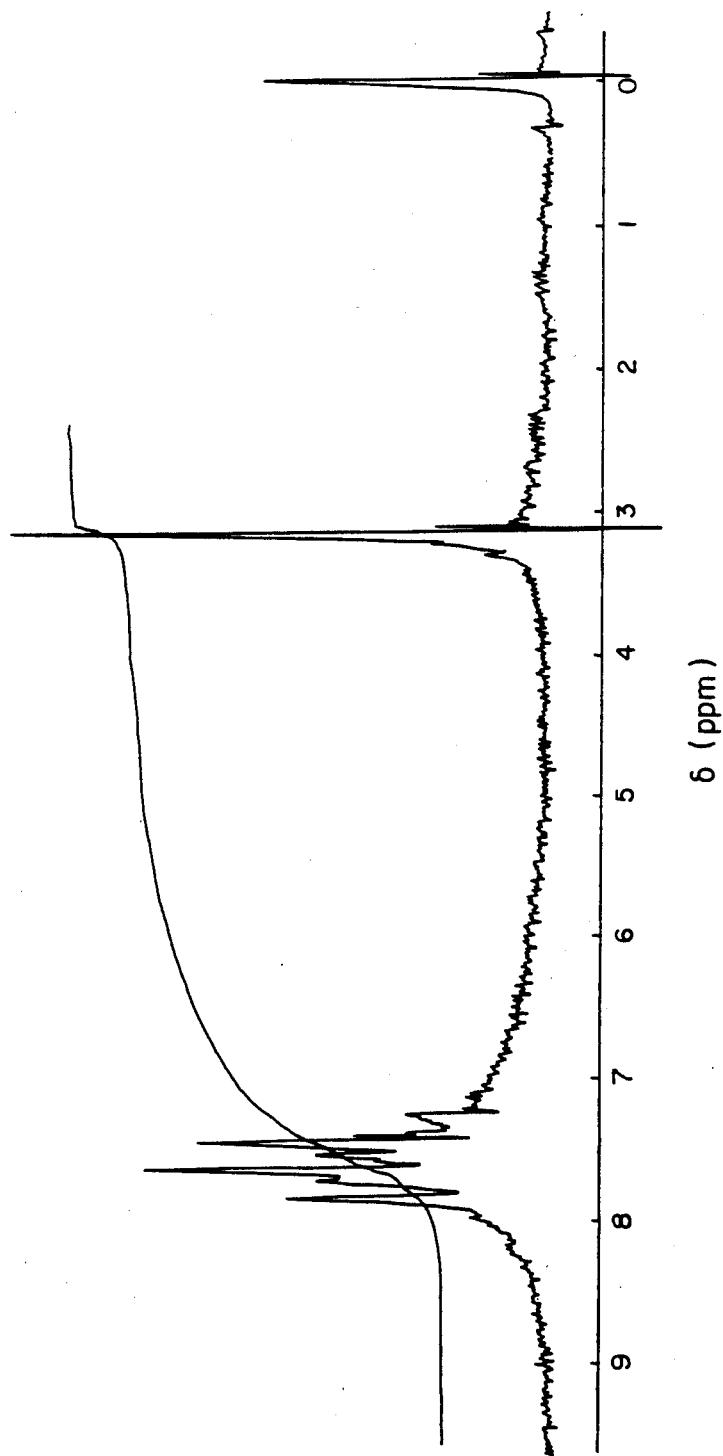
FIGS. 1 to 8 show the proton nuclear magnetic resonance spectra of the polymers obtained in Examples of this invention at 100 MHz.

The weight-average molecular weight of the polymer having a recurring unit represented by the formula (I) ranges from 1,000 to 1,000,000, and preferably from 5,000 to 500,000. The weight-average molecular weight of the polymer consisting of recurring units represented by the formulas (I) and (II) ranges from 1,000 to 1,000,000, and preferably from 5,000 to 500,000. If the weight-average molecular weight is lower than 1,000, the resulting polymer will have poor physical properties, for example, a uniform resist can be hardly obtained when they are used as an electron-beam resist material or an ultraviolet resist material. On the contrary, if the weight-average molecular weight is more than 1,000,000, the polymer will be insoluble to solvents.

As $R_1$, $R_2$, $R_3$ and $R_4$ in the formula (I), a hydrogen atom, a $C_{1-4}$ alkyl group, a phenyl group or a halogen atom is preferred. A hydrogen atom is more preferred when the recurring unit of the formula (I) is contained in the copolymer.

As X and Y in the formula (II), a hydrogen atom, a halogen atom, a $C_{1-6}$ alkyl group, a cyclohexyl group, a phenyl group, a naphthalene group, an anthracene group or a trimethyl silyl group is preferred.

Preferred weight ratio of the recurring unit of the formula (I) to the recurring unit of the formula (II) ranges from 5/95 to 95/5. If the weight ratio of the unit of the formula (I) is too small, the resulting resist will have lower sensitivity when the copolymer is used as an electron-beam resist material or an photosensitive resin material. Further, when the copolymer is used as a heatresistant resin, the resulting coating and molding products will have lower heat resistance. On the contrary, if the weight ratio of the unit of the formula (I) is too large, crack and peeling will be easily caused when the copolymer is used as coating materials.

The poly(ethynylphenyl)acetylene of this invention can be prepared by polymerizing the monomer of the formula (III)

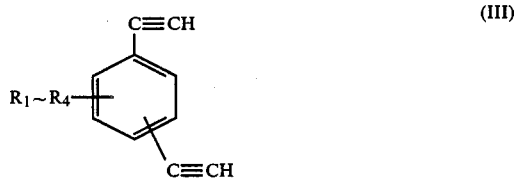

wherein $R_1$, $R_2$, $R_3$ and $R_4$ each independently is a hydrogen atom, $C_{1-10}$ alkyl group, a $C_{6-10}$ cycloalykyl group, an aryl group, or a halogen atom and the ehtynyl group is in either meta position or para position to the other ethynyl group; in the presence of a catalyst.

The copolymers of this invention can be prepared by reacting the monomer of the formula (III) with the monomer of the formula (IV)

wherein X and Y each independently is a $C_{6-20}$ aryl group, a $C_{1-10}$ alkyl group, a $C_{6-10}$ cycloalkyl group, a silyl group having a $C_{1-10}$ alkyl group, or a $C_{6-10}$ aryl group, a hydrogen atom or a halogen atom; in the presence of a catalyst.

As $R_1$, $R_2$, $R_3$ and $R_4$ in the formula (III), a hydrogen atom, a $C_{1-4}$ alkyl group, a phenyl group or a halogen atom is preferred.

Exemplary monomers of the formula (III) which can be employed in this invention include p-diethynylbenzene, m-diethynylbenzene, 2-chloro-1,4-diethynylbenzine, 6-methyl-1,4-diethynyl benzene, 2,4-diethynylbiphenyl and 2,3,5,6-tetrafluoro-1,4-diethynylbenzene. As the monomer employed to obtain the copolymer, p-diethynylbenzene or m-diethynylbenzene is more preferred.

As X and Y in the formula (IV), a hydrogen atom, a halogen atom, a $C_{1-6}$ alkyl groups, a cyclohexyl group, a phenyl group, a naphthalene group, an anthracene group or a trimethyl silyl group is preferred.

Exemplary monomers of the formula (IV) which can be employed in this invention include phenylacetylene, diphenylacetylene, 1-ethynylnaphthalene, 2-ethynylnaphthalene, 1-phenyl-2-chloroacetylene, 9-ethynylanthracene, cyclohexylacetylene, 1-propyne, 1-butyne, 2-butyne, 1-hexyne, 2-hexyne, 1-heptyne and trimethylsilylpropyne.

As the catalyst which can be employed in the polymerization of this invention, a metal carbene compound of which metal is selected from the group consisting of molybdenum, tungsten, niobium and tantalum is employed.

Exemplary metal carbene compounds include the compounds of the formula (V):

wherein
M is tungsten and molybdenum, $R_5$ is a $C_{1-10}$ alkoxy group or a $C_{6-10}$ aryl group, and $R_6$ is a $C_{1-10}$ alkyl group, a $C_{3-10}$ cycloalkyl group, a $C_{6-10}$ aryl group or a hydrogen atom;

the compounds obtained by reacting tungsten hexachloride or molybdenum pentachloride with monosubstituted acetylene represented by the formula (VI):

wherein
$A_1$ is a $C_{1-10}$ alkyl group, a $C_{6-14}$ aryl group, a $C_{3-10}$ cycloalkyl group or a silyl group having a $C_{1-10}$ alkyl group or a $C_{6-10}$ aryl group;

and the compound obtained by reacting niobium pentachloride or tantalum pentachloride with disubstituted acetylene represented by the formula (VII):

wherein
$A_2$ and $A_3$ each independently is a $C_{1-10}$ alkyl group, a $C_{6-10}$ aryl group, a $C_{3-10}$ cycloalkyl group or a silyl group having a $C_{1-10}$ alkyl group or a $C_{6-10}$ aryl group.

Since these catalyst compounds have high selectivity for the monomer, gel cannot be produced until the conversion of the monomer represented by the formula (III) reaches about 50%. Among these catalysts, the compounds of the formula (V) wherein M is tungsten, and the compounds obtained by reacting tungsten hexachloride with monosubstituted acetylene represented by the formula (VI) are more preferred.

The preferable mol ratio of the catalyst to the monomer is not more than 1/5, and 1/10 to 1/1,000 is more preferred. If the amount of the catalyst is too much, the molecular weight of the polymer thus obtained will be apt to decrease. On the contrary, if the amount of the catalyst is too small, both conversion of the monomer and yield of the polymer will be poor.

Either in the reaction producing the poly(ethynylphenyl)acetylene or its copolymers, the concentration of the total amount of the monomers which represented by the formulas (III) and (IV) is preferably 0.1 to 50 mol per liter of solvent, and more preferably 0.1 to 10 mol/l. The concentration of the catalyst which is employed in the reaction is preferably 0.01 to 5 mol per liter of solvent, and more preferably 0.01 to 1 mol/l. If the monomers of the formulas (III) and (IV) are added to a reactor at the same time, a random copolymer will be produced, and the other hand, block copolymer will be produced when the monomers are added separately.

As $R_5$ in the formula (V), a $C_{1-6}$ alkoxy group or a phenyl group is preferred, and as $R_6$ in the formula (V), a $C_{1-6}$ alkyl group or a phenyl group is preferred in view of the preparation of the catalyst. Preferable compounds of the formula (V) include methoxyphenylcarbenepentacarbonyltungstene, diphenylcarbenepentacarbonyltungstene, methoxymethylcarbenepentacarbonyltungstene, methoxyphenylcarbenepentacarbonylmolybdenum, diphenylcarbenepentacarbonylmolybdenum, methoxymethylcarbenepentacarbonylmolybdenum and the mixture thereof.

As $A_1$ in the formula (VI), a $C_{1-6}$ alkyl group, a phenyl group, a naphtyl group or a silyl group having a $C_{1-6}$ alkyl group is preferred. Exemplary monosubstituted acetylenes of the formula (VI) include phenylacetylene, β-naphthylacetylene, 1-pentyne, 1-hexyne, 1-heptyne, 1-octyne, and trimethylsilylacetylene, and in view of the stability of the resulting catalyst and the commercial availability, phenylacetylene and trimethylsilylacetylene are more preferred.

The reaction between the monosubstituted acetylene of the formula (VI) and tungsten hexachloride or molybdenum pentachloride can be carried out in solvent mentioned later at 0° to 50° C., preferably 20° to 40° C., for 0.5 to 2 hours. The amount of the monosubstituted acetylene of the formula (VI) which can be employed in the reaction is 1 to 10 mol, preferably 2 to 5 mol, per mol of the metal chloride.

As $A_2$ and $A_3$ in the formula (VII), a chlorine atom, a $C_{1-6}$ alkyl group, a phenyl group, a naphtyl group, or a trimethylsilyl group is preferred. Exemplary disubstituted acetylenes of the formula (VII) include 2-pentyne, 2-hexyne, 3-hexyne, 2-octyne, 3-octyne, 4-octyne, α-naphtyl-1-propyne, diphenylacetylene and trimethylsilylpropyne.

The reaction between the disubstituted acetylene of the formula (VII) and niobium pentachloride or tantalum pentachloride can be carried out in solvent mentioned later at 0° to 100° C., preferably 40° to 80° C., for 0.5 to 2 hours. The amount of the disubstituted acetylene of the formula (VII) which can be employed in the reaction is 1 to 10 mol, preferably 2 to 5 mol, per mol of the metal chloride.

The solvents which can be employed in the reaction between the metal chloride and the substituted acetylene include aromatic hydrocarbons such as benzene, toluene, and xylene; halogenated hydrocarbons such as carbon tetrachloride and chloroform; and ethers such as diethyl ether and dioxane.

The polymerization reactions of this invention can be carried out in the presence of a solvent. As the solvent, the same solvent as that employed in the reaction between the metal chloride and the substituted acetylene can be used. Accordingly, when the compound obtained by reacting the metal chloride and the substituted acetylene is used as the polymerization catalyst, the solvent used in the preparation of the catalyst and contained in the catalyst solution is used as the polymerization solvent.

It is preferable to conduct the polymerization reactions in atmosphere of inert gas such as argon or nitrogen.

The reaction temperature of the polymerization reactions of this invention ranges from 0° to 120° C., in general. When the compound of the formula (V) is used as a catalyst, 60° to 120° C. is the preferable reaction temperature, and when other catalyst is employed, 20° to 80° C. is preferred.

To obtain the linear polymer with high yield, it is preferable to stop the polymerization reaction at the conversion of the monomer of not more than 50%. If the conversion becomes higher, gel products will increase.

The polymerization reactions can be stopped by adding lower alcohols such as methanol; lower ketones such as acetone; acetonitrile or water to the reaction solution.

The polymers obtained in this invention are dark red powders, in general, soluble in halogenated hydrocarbons, aromatic hydrocarbons and ketones, while insoluble in aliphatic hydrocarbons and lower alcohols.

And it is proved that the main chain of the polymers are linear conjugated double bonds and ethynyl groups are pendant to the main chain through phenylene by proton magnetic resonance spectrum, $C^{13}$ nuclear magnetic resonance spectrum, and Raman spectrum.

Since the polymers of this invention have ethynyl groups, it is applicable to electron-beam resist, photosensitive resin, thermosetting-type heatresistant resins and the like. Especially, when the polymers of this invention are used as photosensitive resins and electron-beam resist, advantages such as high sensitivity, high dry etching resistance and uniform coating property are obtained. When the polymers of this invention are used as heatresistant resins they are observed no weight loss over 400° C. in air and high modulus. The polymers of this invention can be also applied for electroconductive materials because the polymer chain consists of conjugated double bonds. Purified poly(ethynylphenyl)acetylene of this invention is an insulator having an electroconductivity of lower than $10^{-9}\Omega^{-1}\cdot cm^{-1}$, however when this polymer is baked at 400° C. in nitrogen atmosphere, it shows the electroconductivity of $10^{-6} \sim 10^{-7}\Omega^{-1}\cdot cm^{-1}$.

To improve the molding and casting property of the polymers of this invention, there are two ways. One way is adding a crosslinking agent which reacts with the polymers to result the flexible crosslinking chains to the polymers. By using the crosslinking agent, it is possible to relax the concentration of stress that is caused at the time of hardening the polymers with heat or electromagnetic waves at the flexible parts of the crosslinking chains. It is also possible to obtain the uniform coating and molded products. The inventors of this invention have found that the crosslinking is produced by the reaction between the ethynyl groups and the aryl groups, mainly "concerted cycloadition reaction", by studying IR spectra of the polymers hardened with heat or light.

As the crosslinking agent, diacetylene compounds having the formula (III) described as the monomer can be employed. In view of the heat resistance, diethynylbenzene or 2,4-diethynylbiphenyl is preferred.

Other crosslinking agents which can be preferably used of this invention include organic aromatic compounds having two to four 6-membered aromatic rings which are condensed each other, directly bonded each other, or bonded each other through one oxygen atom, one sulfur atom, one nitrogen atom, one phosphorus atom, a methylene group, a dimethylmethylene group, an ethylene group, a vinylene group or a keto group, branched polyphenylene having at least two ethynyl groups, and the mixture thereof. As the organic aromatic compounds, anthracene, 1-methylanthracene, α-methylnaphthalene, 1,4-dimethylnaphthalene, phenanthrene, pyrene, triphenylene, acenaphthene, quinoline, biphenyl, 2,2'-diquinolyl, phenylnaphthalene, 3,3'-dimethylbiphenyl, 1,2-diphenylbenzene, 1,4-diphenylbenzene, 3,3-dipyridyl, 4,4'-dipyridyl, 2,4-diphenylpyridine, 2,3,6-triphenylpyridine, diphenyl ether, diphenyl sulfide, diphenyl sulfone, triphenyl amine, diphenyl amine, triphenylphosphine oxide, diphenylmethane, diphenylpropane, stilbene or benzophenone is employed. And as a branched polyphenylene, H-Resin developed by Hercules Inc. of the molecular weight of 900 to 12,000 is preferred.

Other crosslinking agents which can be employed in this invention include aromatic compounds having the formula (VIII):

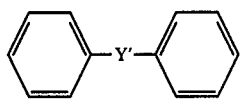
(VIII)

wherein
Y' is —S—, —O—, —NH—, or —SO$_2$—.

Other crosslinking agents which can be employed in this invention include aromatic polyimide compounds of which a weight-average molecular weight is not more than 10,000 and preferably not more than 5,000. Among them, the aromatic polyimide compound having the formula (IX) or the formula (IX') is preferred.

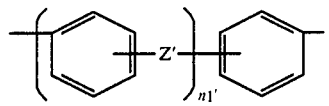
(IX')

(wherein Z' is —O—, —S—, —CO—, —SO$_2$—, —C(CF$_3$)$_2$— or —CF$_2$— and n$_1$' is an integer of 0 to 5), R$_1$' and X' each independently is —O—, —S—, —CO—, —SO$_2$—, —C(CF$_3$)$_2$—, or —CF$_2$— and n' is an integer of 0 to 5).

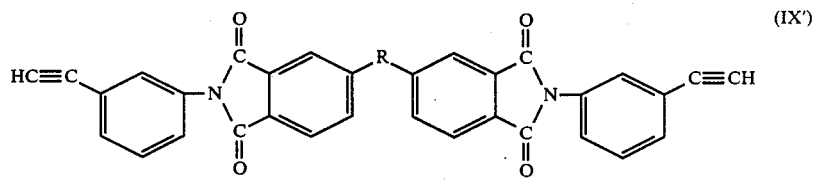
(IX')

wherein R is —S—, —C(CF$_3$)$_2$—, —CF$_2$—, —O—, or —SO$_2$—.

As the aromatic polyimide compounds of the formula (IX), THERMID MC-600 (product of National Starch and Chemical Corp.) is preferred in view of the commercial availability.

Other crosslinking agents which can be employed in this invention include aromatic polyamide ester compound of which a weight-average molecular weight is not more than 10,000 and preferably not more than 5,000. Among them, the aromatic polyamide ester compounds of the formula (X) are preferred.

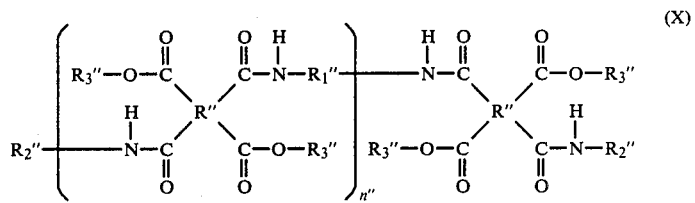
(X)

wherein
R" is

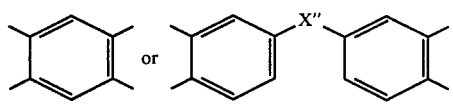

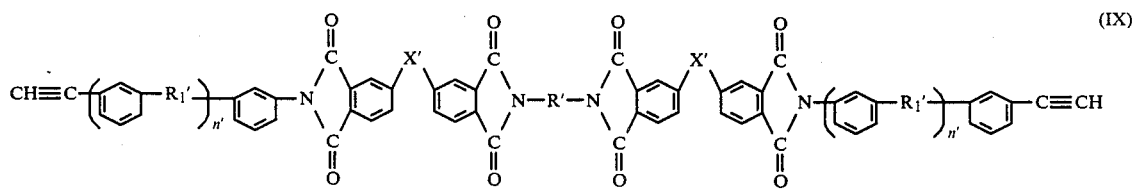
(IX)

wherein
R' is (wherein X" is —O—, —S—, —CO—, —SO$_2$—, —C(CF$_3$)$_2$—, or —CF$_2$—), R$_1$" is

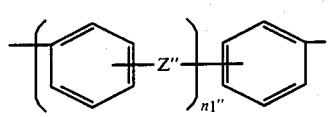

(wherein Z" is —O—, —S—, —CO—, —SO₂—, —C(CF₃)₂—, or —CF₂— and $n_1''$ is an integer of 0 to 5), $R_2''$ has the same meaning as $R_1''$ or the ethynyl group substituent thereof, $R_3''$ is a $C_{1-10}$ alkyl group, a $C_{6-10}$ aryl group, a $C_{6-10}$ cycloalkyl group or a $C_{2-10}$ hydrocarbon having at least one ethylenically double bond, and n" is an integer of 0 to 10.

In the formula (X), $n_1''$ and n" are preferably zero. As $R_3''$ in the formula (X), a $C_{1-7}$ alkyl group or a phenyl group is preferred.

Other crosslinking agents which can be employed in this invention include condensed heteroaromatic compounds such as quinoxaline compounds having hte formula (XI) and the compoounds having the formula (XII), (XIII), or (XIV).

Ar' is

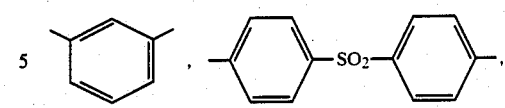

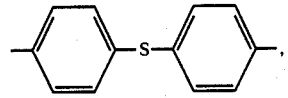

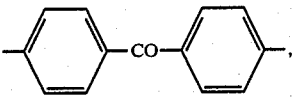

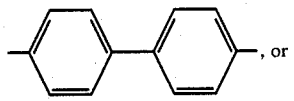

, or

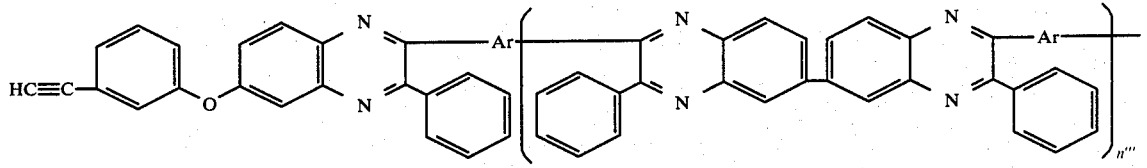

(XI)

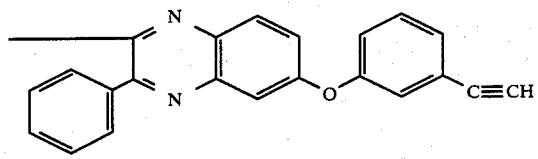

wherein
Ar is

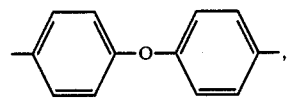

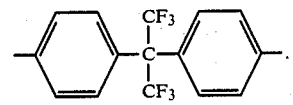

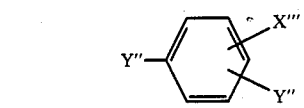 (XIV)

wherein
Y" is —SH, —NH₂, or —OH and X''' is —H, or —Cl.

The other way which improves the molding property of the polymers of this invention is adding a plasticizer having high compatibility to the polymers of the present invention to the polymers.

Exemplary plasticizers which can be employed in this invention include phthalates having the formula (XV) and triglycerides having the formula (XVI).

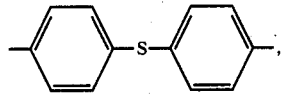

and n''' is 0 or 1.

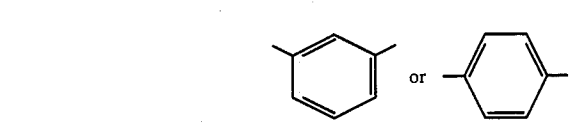 (XII)

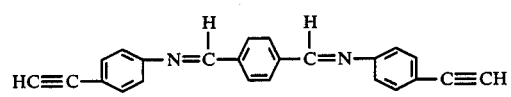

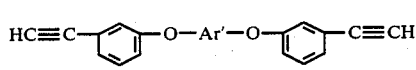 (XIII)

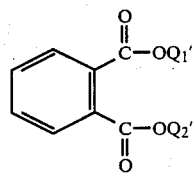 (XV)

wherein wherein $Q_1'$ and $Q_2'$ each independently is a $C_{1-10}$ alkyl group or an allyl group.

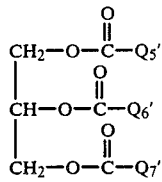 (XVI)

wherein
$Q_5'$, $Q_6'$ and $Q_7'$ each independently is a $C_{1-10}$ alkyl group.

In the formula (XV), it is preferred that $Q_1'$ and $Q_2'$ are the same, and more preferably, $Q_1'$ and $Q_2'$ are both $C_{1-6}$ alkyl groups or allyl groups. In the formula (XVI), it is preferred that $Q_5'$, $Q_6'$ and $Q_7'$ are the same, and more preferably, $Q_5'$, $Q_6'$ and $Q_7'$ are all $C_{1-6}$ alkyl groups.

The weight percentage of the crosslinking agent or plasticizer based on the total weight of the resin composition is about 3 to about 50%, preferably about 5 to about 30%.

When the resin compositions having the improved molding property of this invention are used as electron-beam resist and heatresistant insulating film applied to LSI, it is required to have high adhesive property to the substrate such as silicone wafer. The resin compositions having high adhesive property can be obtained by adding the organo silicone compound having the formula (XVII) as an adhesive agent.

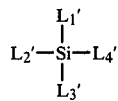 (XVII)

wherein
$L_1'$, $L_2'$, $L_3'$, and $L_4'$ each independently is a $C_{1-10}$ alkyl group, a $C_{1-10}$ alkoxy group, a phenyl group, an acryl group- or methacryl group-substituted $C_{0-5}$ aliphatic hydrocarbon, a $C_{2-5}$ alkenyl group, a $C_{2-5}$ alkenyloxy group, a $C_{2-5}$ alkynyl group, or a $C_{2-5}$ alkynyloxy group, and at least one of $L_1'$, $L_2'$, $L_3'$, or $L_4'$ has C—C double bond or C—C triple bond.

As $L_1'$, $L_2'$, $L_3'$ and $L_4'$ in the formula (XVII), alkyl group such as methyl group; alkoxy group such as methoxy group and ethoxy group; acryl group- or methacryl group-substituted $C_{0-5}$ aliphatic hydrocarbon such as acryl group, methacryl group and

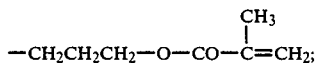

$C_{2-5}$ alkenyl group such as vinyl group, allyl group and 2-butenyl group; $C_{2-5}$ alkenyloxy group such as allyloxy group; $C_{2-5}$ alkynyl group such as —C≡C—CH$_3$ and —CH$_2$—C≡CH; or $C_{2-5}$ alkynyloxy group such as —O—CH$_2$—C≡CH can be employed.

The weight percentage of the adhesive agent based on the total weight of the resin composition is about 1 to about 15%.

The polymers of this invention and the resin compositions having the improved molding and adhesive properties of this invention can be crosslinked with heat or electromagnetic waves such as electron-beam, X rays and deep ultraviolet rays. However, in case of using ultraviolet rays, the crosslinking cannot occur if the wave length is 300 nm or more. Since photoresist materials are usually used under a high-pressure mercury lamp, it is useless if the photoresist materials have no reactivity to ultraviolet rays of the wave length of 300 nm or more or visible light, especially the light having the wave length of 300 to 500 nm. The reactivity can be given to the polymers and the resin compositions of this invention by adding a photocrosslinking initiator to them.

As the photocrosslinking initiator which can be employed in this invention, the following three types of initiators are preferred.

One is the compounds producing a radical under light having the wave length of 300 to 500 nm. As such compounds, disulfides having the formula (XVIII), benzoin derivatives having the formula (XIX) or benzil compounds having the formula (XX) are preferred.

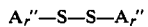 (XVIII)

wherein
$Ar''$ is

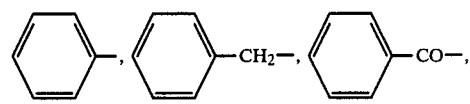

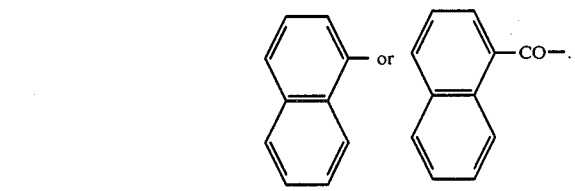

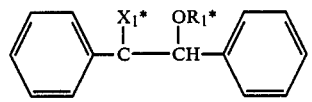 (XIX)

wherein
$X_1^*$ is =O or =N—OH and $R_1^*$ is a hydrogen atom or —CH$_3$.

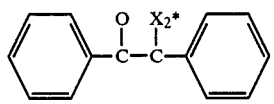 (XX)

wherein
$X_2^*$ is =O or

—OCH$_3$.

The second initiators consist of two kinds of compounds. The compound which can excite under light having the wave length of 300 to 500 nm and the compound producing a radical by reacting with the excited compound are used at the same time. Exemplary combinations of the compounds include fluorescein having the fromula (XXI) and a compound having the formula (XXII), thiazine having the formula (XXIII) and a compound having the formula (XXII), and a benzophenone derivative having the formula (XXV) and a diaminobenzophenone compound of the formula (XXIV).

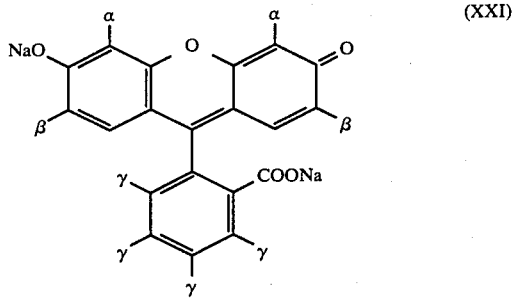
(XXI)

wherein
α is a bromine atom or an iodine atom. β is a bromine atom, an iodine atom or a nitro group, and γ is a chlorine atom or a hydrogen atom.

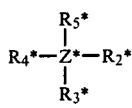
(XXII)

wherein Z* is

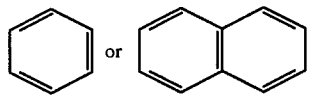

$R_2^*$ is —OH, —SH, —NH$_2$, or —H, $R_3^*$ and $R_4^*$ each independently is —H or a halogen atom, $R_5^*$ is —OH, —SH, or —NH$_2$, and $R_2^*$, $R_3^*$, $R_4$, and $R_5^*$ may be in any position in Z*.

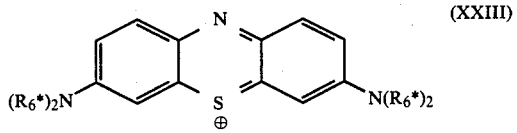
(XXIII)

wherein
$R_6^*$ is a hydrogen atom or a methyl group.

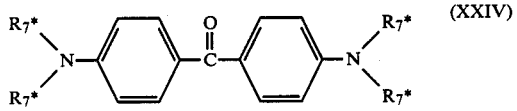
(XXIV)

wherein
$R_7^*$ is a methyl group or an ethyl group.

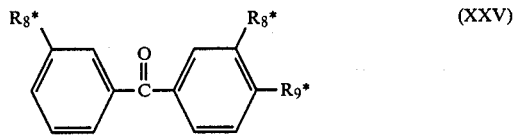
(XXV)

wherein
$R_8^*$ is a hydrogen atom or a methyl group and $R_9^*$ is a methoxy group or a hydrogen atom.

In this type photocrosslinking initiator combinations, for example in the combination of benzophenone reoresented by the formula (XXV) and dimethylaminobenzophenone represented by the formula (XXIV), it is considered that the crosslinking reaction occurs by the following process, firstly exciting dimethylaminobenzophenone with light having the wave length of 300 to 500 nm, reacting the excited dimethylaminobenzophenone with benzophenone, transferring the hydrogen in N-methyl group to the carbonyl group in benzophenone and attacking the free ethynyl group of the polymer with diphenylcarbinol radical thus produced.

Another preferable photopolymerization initiator which can be employed in this invention is a compound which can extract a hydrogen atom from the ethynyl group contained in the recurring unit of the formula (I) to produce an acetylene radical under light having the wave length of 300 to 500 nm. As the compound, anthraquinone compound having the formula (XXVI) or thioxanthone compound having the formula (XXVII) is preferred.

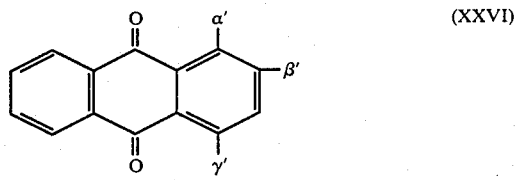
(XXVI)

wherein
α' is a hydrogen atom, —OH, —NH$_2$, a chlorine atom, or —NO$_2$, β' is a methyl group, an ethyl group, a t-butyl group, a n-pentyl group, a chlorine atom, or a hydrogen atom, and γ' is a hydrogen atom, —OH, or —NH$_2$.

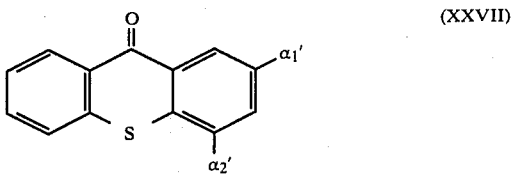
(XXVII)

wherein
$α_1'$ is a hydrogen atom, a chlorine atom, an i-propyl group, or an ethyl group, and $α_2'$ is a hydrogen atom, an ethyl group, or an i-propyl group.

As the photocrosslinking initiator, β-naphthylazide, N-(4-azidosulfonylphenyl)maleinimide, or 2,6-bis(p-azidobenzylidene)cyclohexanone can be also employed. The photocrosslinking process of the composition including those azides is not clear, but it is considered that they are decomposed to nitrene under ultraviolet light and the nitrene extracts a hydrogen atom of the ethynyl group pendant to the polymers of this invention.

The weight percentage of the photopolymerization initiator based on the total weight of the resin composition is about 0.1 to about 20%, preferably about 0.5 to about 5%.

The photocrosslinkable resin composition comprising the polymer of this invention and the photocrosslinking initiator described above can be used as a photoresist which can result in patterns with high sensitivity and high resolution.

The resin compositions in this invention consist essentially of (i) a polymer as defined in Claim 1 or in Claim 7 and (ii) at least one agent selected from the group consisting of (a) an improvement agent for casting and molding property in an amount of about 3 to about 50% by weight based on the weight of the polymer; (b) an adhesive agent in an amount of about 1 to about 15% by weight based on the weight of the polymer; and (c) a photocrosslinking initiator in an amount of about 0.1 to about 20% by weight based on the weight of the polymer.

The present invention is further illustrated by referring to the following Examples, by which the present invention is not limited at all.

SYNTHESIS EXAMPLE 1

In 5 ml of benzene was dissolved 1 m mole of methoxyphenylcarbenepentacarbonyltungsten to obtain a catalytic solution. Subsequently, the solution of 10 m moles of p-diethynylbenzene in 10 ml of benzene was added to the catalytic solution in a stream of nitrogen, and made to react at 60° C. After 5 hours reaction, it was found by gas chromatography (its internal standard was xylene) that approximately 55% of monomer was consumed. About 2 ml of acetone was added to stop the reaction, and the reacting solution was poured into 100 ml of n-hexane to deposit the polymer. Then, the reaction compound was filtered and dried under vacuum condition at room temperature. The yield of the polymer thus obtained was about 40%, and the weight-average molecular weight was determined approximately 18,000 by gel permiation chromatography (it was hereinafter referred to as GPC). The polymer thus obtained was dark red powder, and it was soluble in halogenated hydrocarbons such as chloroform, aromatic hydrocarbons such as benzene and toluene, and ketons such as acetone, while it was insoluble in lower alcohol such as methanol, aliphatic hydrocarbons such as hexane. FIG. 1 shows the protone nuclear magnetic resonance spectrum (NMR spectrum) of said polymer in chloroform-$d_1$.

SYNTHESIS EXAMPLE 2

In 100 ml of toluene was added 0.59 g of tungsten hexachloride and they were stirred at room temperature for 30 minutes, and 0.77 g of phenylacetylene was added thereinto, and further stirred at room temperature for 1 hour. The mixed solution was added to 200 ml of toluene solution dissolved 12.6 g of m-diethynylbenzene, and they were stirred at 30° C. for about 3 hours. All reactions described above were carried out in a stream of nitrogen. Then, 20 ml of methanol was added to stop the reaction and air was bubbled through the reaction solution for about 5 hours. The case that it was needed to remove completely the inactivated tungsten compound, said reaction mixture was needed to be washed with dilute hydrochloric acid. The reaction solution was concentrated to 100 ml by an evaporator, and poured into 500 ml of n-hexane, and polymer was obtained as precipitate. The chemical characteristics and the spectrum data of the polymer thus obtained were same as the polymer obtained in Synthesis Example 1. Its weight-average molecular weight determined by GPC was ca. 23,000.

SYNTHESIS EXAMPLE 3-9

Polymerizations were effected in the same manner as in Synthesis Example 1 or 2, except that catalysts and monomers were changed respectively. (The catalyst type used in Synthesis Example 2 was represented as

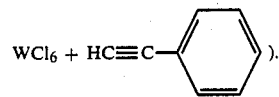

These results are summarized in Table 1.

COMPARATIVE EXAMPLE 1

In 50 ml of carbon tetrachloride was added 2 m moles of W(CO)$_6$, and they were irradiated with light by a high pressure mercury lamp of 300 W, thus the catalytic solution was obtained. The resulting catalytic solution was added dropwise to 50 ml of carbon tetrachloride solution containing 10 m moles of p-diethynylbenzene in a stream of nitrogen at 60° C. After 1 hour, 10 ml of methanol was added thereto in order to stop the reaction, and a solid product was filtered off. The filtrate was concentrated to 20 ml, and added to 200 ml of n-hexane to deposit the polymer. The polymer thus obtained was filtered and washed with methanol, dried under reduced pressure at room temperature. In this reaction, the monomer conversion measured by the same manner in Synthesis Example 1 was 60%, while the last yield of the polymer was only 6%. The weight-average molecular weight of the polymer was approximately 25,000. NMR spectrum data and the chemical characteristics of the polymer were agreed with the result of Synthesis Example 1. Elementary analysis values were carbon 95.02% and hydrogen 4.80%.

COMPARATIVE EXAMPLE 2

A polymerization was effected in the same manner as in Comparative Example 1 except that Mo(CO)$_6$ was used in place of W(CO)$_6$. The polymer's weight-average molecular weight measured by GPC was approximately 3,400, and its yield was about 4%. Its NMR spectrum data and the chemical characteristics were same as in Comparative Example 1.

COMPARATIVE EXAMPLE 3

In 50 ml of benzene was added 0.5 m moles of WCl$_6$ to obtain a catalytic solution, then 50 ml of benzene solution containing 10 m moles of p-diethynylbenzene was thereto added with stirring. The reaction was carried out in a stream of nitrogen a 30° C. The monomer conversion was measured by gas chromatography (its internal standard was xylene). After 30 min. to 1 hour, the conversion of the monomer reached to equilibrium, and the remarkable precipitate of gel product was showed with the elapse of reaction time. Therefore, in order to expect a high yield of the polymer, it is preferable to stop the reaction after 15 to 30 minutes from the beginning of the reaction. The reaction was stopped by the addition of a small amount of ammoniac methanol. After that the gel product was filtered off, the filtrate was poured into 300 ml of n-hexane to deposit the desired polymer. The polymer thus obtained was filtered, washed with methanol, and vacuum dried at room temperature. The polymer's yield was about 4%, and its weightaverage molecular weight determined by GPC was approximately 10,000. Its NMR spectrum data and its chemical characteristics were agreed with those of Synthesis Example 1.

COMPARATIVE EXAMPLE 4

In 40 ml of toluene were added 0.5 m moles of tetra-n-buthyltitanate and 2 m moles of triethylaluminium in a stream of argon to obtain a catalytic solution. Subsequently 20 ml of toluene solution containing 10 m moles of p-diethynylbenzene was thereto added also in a stream of argon at room temperature. After 24 hours, 10 ml of methanol was added to stop the reaction, the gel product was filtered off, and the filtrate was poured into 100 ml of methanol/conc-hydrochloric acid (10:1) to deposit the polymer. The polymer was filtered, and washed with methanol/conc-hydrochloric acid first, and next washed with methanol, then it was dried under reduced pressure at room temperature.

Its weight-average molecular weight determined by GPC (the column was SHODEX AC-803 +AC-804) was 20,000, and its chemical properties were agreed with those of Synthesis Example 1. The yield of the polymer was about 5%. These results are summarized in Table 2.

SYNTHESIS EXAMPLE 10

In 5 ml of benzene was dissolved 1 m mole of methoxyphenylcarbenepentacarbonyltungsten to obtain a catalytic solution. In 10 ml of benzene were dissolved 5 m moles of p-diethynylbenzene and 5 m moles of phenylacetylene, and said catalitic solution was added thereto in a stream of nitrogen at 60° C. After 5 hours' reaction, it was found by gas chromatography (its internal standard was xylene) that 55% of p-diethynylbenzene and 35% of phenylacetylene were consumed. About 2 ml of acetone was added to stop the reaction, the reacting solution was poured into 100 ml of n-hexane. The precipitrated copolymer was filtered and dried under vacuum condition at room temperature. The yield of the copolymer thus obtained was about 40%, and the weight-average molecular weight was determined approximately 15,000 by GPC. The composition rate of said copolymer was determined by NMR (100 MHz, shown in FIG. 2) as follows.

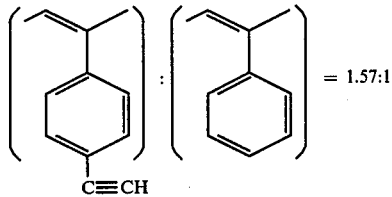

SYNTHESIS EXAMPLE 11-21

Copolymerizations were effected in the same manner as in Synthesis Example 10, except that catalysts and monomers were changed as shown in Table 3. Results are shown in Table 3, and FIG. 3 to FIG. 8.

COMPARATIVE EXAMPLES 5-9

Copolymerizations were effected in the same manner as in Synthesis Example 10, except that catalysts and monomers were changed as shown in Table 4. The catalists were conventional ones. Results are also shown in Table 4.

SYNTHESIS EXAMPLES 22-26

Copolymerizations were effected in the same manner as in Synthesis Example 2, except that catalysts and monomers were changed as shown in Table 3. Results are also shown in Table 3.

SYNTHESIS EXAMPLE 27

The polymer obtained by Synthesis Example 2 was dissolved 15% by weight to N-methylpyrrolidone. Thereto, the compounds listed in Table 5 were dissolved 4% by weight respectively, and each solution was casted by using a 20 μm doctor blade in turn to obtain films. Subsequently, the films were dried firstly at 50° C. for 3 hours, secondly at 100° C. for an hour, and lastly at 200° C. for an hour in a stream of nitrogen. Results are shown in Table 5. In case that films were formed without such the improvement agents for molding and casting property as shown in Table 5, the casting films were cracked within an hour under the condition of 50° C. drying.

REFERENTIAL EXAMPLE 1

In 3077 parts by weight of anhydrous benzene were dissolved 630 parts by weight of m-diethynylbenzene and 70 parts by weight of p-diethynylbenzene, they were heated to the reflux temperature in a stream of nitrogen. Subsequently, in 50 parts by weight of anhydrous benzene were mixed 4.4 parts by weight of nickel acetylacetonate and 8.8 parts by weight of triphenylphosphine and the mixture was divided into 4 equal parts. Then the each parts was added every 1 hour at four times to said refluxing solution. After 6 hours and 15 minutes from the first addition, the reacting solution was left for cooling, and added to n-hexane which had about 7 times volume of that of the said reacting solution. As a result, a yellow branched polyphenylene polymer which had ethynyl groups at the terminal was obtained at a yield of approximately 55%. Its weight-average molecular weight was about 2,700.

SYNTHESIS EXAMPLE 28

In 400 parts by weight of ethylene glycol diacetate were dissolved 60 parts by weight of the polymer obtained in Synthesis Example 2 and 40 parts by weight of the polymer obtained in Referential Example 1. The solution thus obtained was coated on the glass plate with a 20 μm doctor blade. After air-dried at 50° C. for 3 hours, the transparent and uniform film was obtained. In case of the solution which contained 400 parts by weight of ethylene glycol diacetate and 100 parts by weight of the polymer obtained in Synthesis Example 2, only the fine cracked film was obtained by the same procedure.

REFERENTIAL EXAMPLE 2

In 1.5 l of anhydrous γ-butyrolaotone was added 130.8 g of pyromellitic acid under a heating at ca. 70° C. Thereto 40.8 g of n-hexyl alcohol was added dropwise, and after 1 hour's reaction, they were left to cool. Subsequently under ice-cold water cooling, 142.7 g of thionyl chloride was added dropwise, and a mixed solution of 43.2 g of p-diaminobenzene and 37.2 g of aniline was added dropwise thereto in limited amounts. After 30 minutes' stirring at room temperature, the reacting solution was heated to 40° C. for 1 hour. It was left to cool and poured into 10 l of water under agitated stirring to precipitate the oligomer. The oligomer was crushed, filtered and washed with water, and finally it was obtained as a slight yellow solid in about 85% yield.

SYNTHESIS EXAMPLE 29

In 400 parts by weight of n-methylpyrrolidone were dissolved 20 parts by weight of the oligomer obtained in Referential Example 2, they were coated on the glass plate by the use of a 20 μm doctor blade. Next the film was baked firstly at 50° C. for 3 hours, secondly at 200° C. for 1 hour and lastly at 350° C. for 1 hour at a stream of nitrogen, to form a transparent, uniform film of the thickness ca. 4 μm.

SYNTHESIS EXAMPLE 30

In 20% by weight of ethylene glycol diacetate were dissolved 20% by weight of the polymer obtained in Synthesis Example 1, and also dissolved 5% by weight of A-172, A-174 (these were produced by Nippon Unica Co., Ltd.), LS-610 or LS-1020 (these were produced by the Shin-etsu Chemical Industry Co., Ltd.), separately. The structural formulas of these silane coupling agents are shown in Table 6. Then, these solutions were respectively coated on the silicone wafers by the use of a spin coater to get films of thickness ca. 1 μm, and the films were hardened by heating at 100° C. for 30 minutes, at 200° C. for 30 minutes, and at 300° C. for 30 minutes. Except that the above silane coupling agents were not added, a casting film was formed only from the polymer obtained in Synthesis Example 1 in the same manner as described above. Next, these films were dipped in boiling water in order to examine whether the hardened films were delaminated or not. As a result, the film which was not added said silane coupling agents were delaminated within 30 minutes' dipping, while any film containing the above silane coupling agents was not delaminated more than 1 hour in boiling water.

SYNTEHSIS EXAMPLE 31

In n-methylpyrrolidone solution containing 20% by weight of the polymer obtained in Synthesis Example 2, 1% by weight portion of photocrosslinking initiators shown in Table 7 was added. Each solution thus prepared was coated on the silicone wafer by the use of a spin coater, air-dried for 1 to 2 hours at 50° C. to form the film of thickness 0.5 to 0.7 μm. In the same manner, a film which was not added the above photocrosslinking initiators was also casted. The films were next irradiated with ultraviolet light by a high pressure mercury lamp of 300 W to receive 2000 m joule of exposure quantity, then developed with toluene to observe the photocrosslinkability. As a result, films which were not added photopolimerization initiators were all soluble in toluene. However, all films added photocrosslinking initiators were insoluble in toluene, so it became apparent that they were photocrosslinked. Further, it was found that without photocrosslinking initiators, photocrosslinking was progressed under deep ultraviolet light having short wavelength less than 300 nm such as a low-pressure mercury lamp or a sterilization lamp.

SYNTHESIS EXAMPLE 32

In 1000 parts by weight of toluene were dissolved 1 part by weight of the polymer obtained in Synthesis Example 3 and 29 parts by weight of polystyrene of the weight-average molecular weight 180,000, the mixed solution was spin coated on a silicone wafer, and vacuum dried at room temperature. Thereto the electron beam was irradiated by an electron microscope (manufactured by Nippon Bunko, 25S-II type) to measure the sensitivity, it was proved to be $10^{-5}$ to $10^{-6}$ coulomb/cm$^2$. Here, the film was developed by immersed in methyl ethyl ketone solution containing 10% of methanol.

TABLE 6

| BRAND NAME | MAKER | Silane Coupling Agents STRUCTURAL FORMULA |
|---|---|---|
| A-172 | Nippon Unica Co., Ltd. | $CH_2=CH-Si-(O-CH_2-CH_2OCH_3)_3$ |
| A-174 | | $CH_3=\overset{CH_3}{\underset{\underset{O}{\|\|}}{C}}-C-O-CH_2-CH_2-CH_2-Si-(OCH_3)_3$ |
| LS-610 | The Shinetsu Chemical | $(CH_3)_3-Si-C\equiv CH$ |
| LS-1020 | Co., Ltd. | $CH\equiv C-CH_2-O-Si-(CH_3)_3$ |

TABLE 1

Results of Polymerization

| Synthesis Example No. | Catalysts | Monomer | Yield (%) | Weight-average molecular weight |
|---|---|---|---|---|
| 1 | $(CO)_5W=C\overset{OCH_3}{\underset{\phenyl}{\diagup}}$ | $HC\equiv C-\phenyl-C\equiv CH$ | 42 | 18,000 |
| 2 | $WCl_6 + HC\equiv C-\phenyl$ | $HC\equiv C-\phenyl-C\equiv CH$ | 37 | 23,000 |

TABLE 1-continued
Results of Polymerization

| Synthesis Example No. | Catalysts | Monomer | Yield (%) | Weight-average molecular weight |
|---|---|---|---|---|
| 3 | (CO)₅W=C(C₆H₅)₂ | HC≡C—C₆H₃(Cl)—C≡CH | 35 | 25,000 |
| 4 | WCl₆ + HC≡C—C₆H₅ | HC≡C—C₆H₃(C≡CH)(CH₃) | 41 | 17,000 |
| 5 | (CO)₅Mo=C(OCH₃)(C₆H₅) | HC≡C—C₆H₃(C≡CH)(C₆H₅) | 18 | 5,400 |
| 6 | (CO)₅W=C(OCH₃)(C₆H₅) | HC≡C—C₆F₄—C≡CH | 45 | 27,000 |
| 7 | MoCl₅ + HC≡C—C₆H₅ | HC≡C—C₆H₄—C≡CH (meta) | 14 | 4,000 |
| 8 | WCl₆ + HC≡C—C₅H₁₁ | HC≡C—C₆H₄—C≡CH (meta) | 40 | 18,000 |
| 9 | WCl₆ + HC≡C—Si(CH₃)₃ | HC≡C—C₆H₄—C≡CH (meta) | 39 | 21,000 |

TABLE 2
Results of Polymerization using Conventional Catalysts

| Comparative Example No. | Catalysts | Monomer | Yield (%) | Weight-average molecular weight |
|---|---|---|---|---|
| 1 | W(CO)₆ Irradiation of a high pressure mercury lamp for 1 hr in CCl₄ | HC≡C—C₆H₄—C≡CH | 6 | 25,000 |

TABLE 2-continued
Results of Polymerization using Conventional Catalysts
| Comparative Example No. | Catalysts | Monomer | Yield (%) | Weight-average molecular weight |
|---|---|---|---|---|
| 2 | Mo(CO)$_6$ Irradiation of a high pressure mercury lamp for 1 hr in CCl$_4$ | 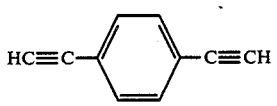 HC≡C—⟨C$_6$H$_4$⟩—C≡CH | 4 | 3,400 |
| 3 | WCl$_6$ | 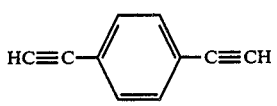 HC≡C—⟨C$_6$H$_4$⟩—C≡CH | 4 | 10,000 |
| 4 | Ti(OC$_4$H$_9$)$_4$ + Al(C$_2$H$_5$)$_3$ Ziegler-Natta catalyst | 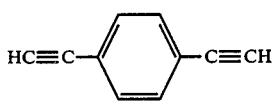 HC≡C—⟨C$_6$H$_4$⟩—C≡CH | 5 | 20,000 |

TABLE 3

Results of Copolymerization

Figure 2:
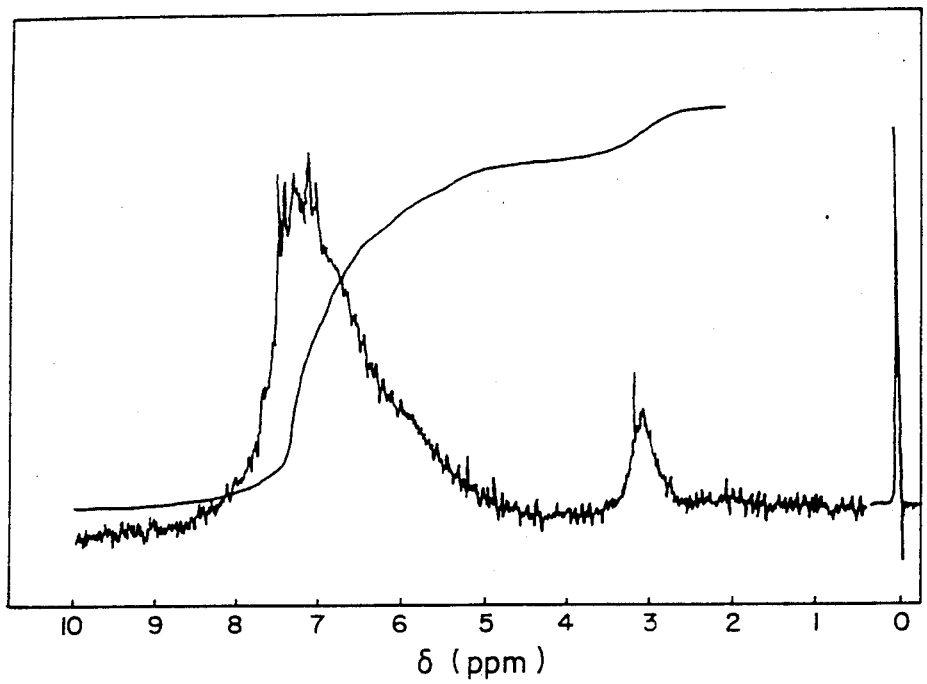
Figure 3:
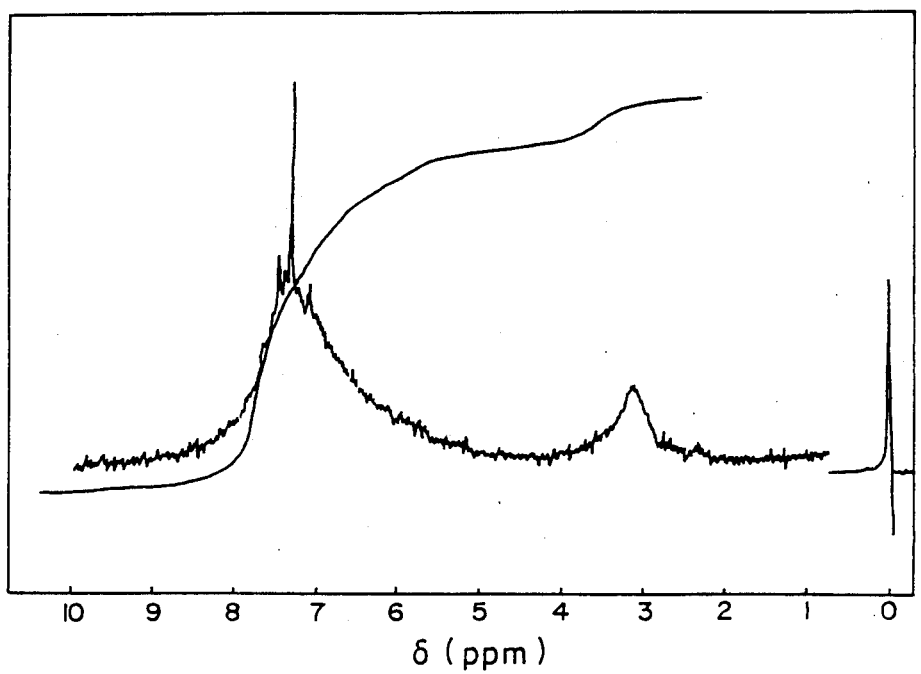
Figure 4:
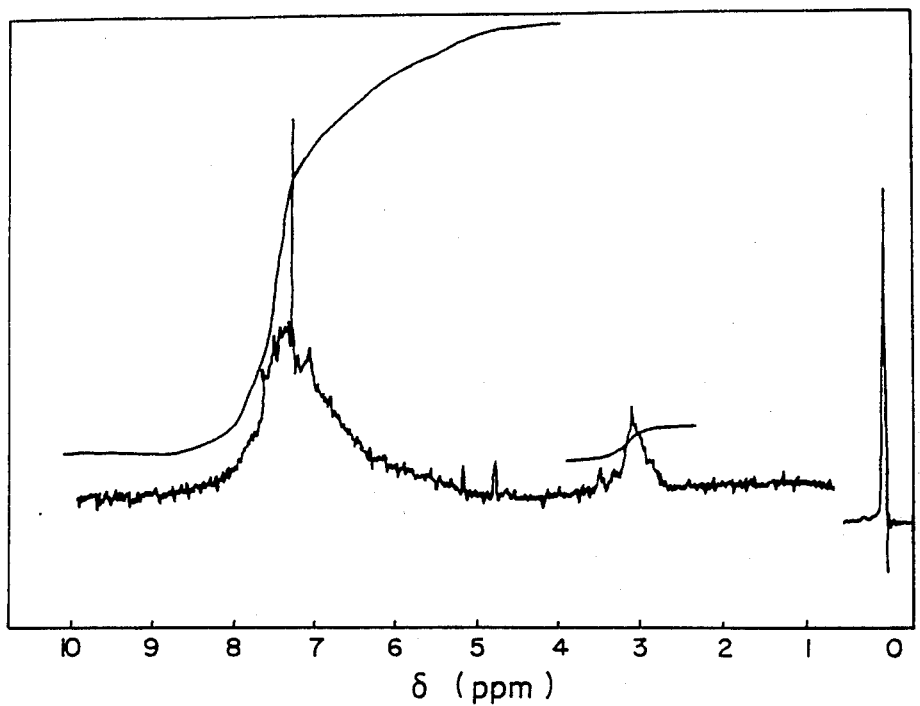
Figure 5:
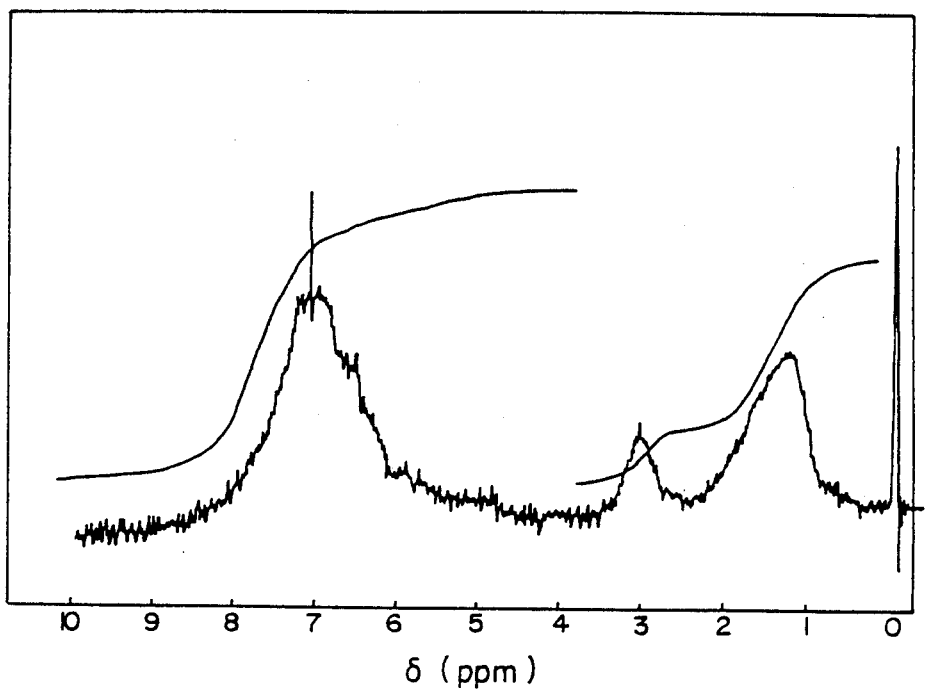

| Synthesis Example No. | Catalysts | Monomer A | Monomer B | A/B (Prepared Ratio) | Weight-average molecular weight | Yield (%) | A/B Composition Ratio in Copolymer | PMR Chart |
|---|---|---|---|---|---|---|---|---|
| 10 | (CO)$_5$W=C(OCH$_3$)(C$_6$H$_5$) | HC≡C-C$_6$H$_4$-C≡CH (para) | HC≡C-C$_6$H$_5$ | 1/1 | 29,000 | 21.0 | 3/2 | FIG. 2 |
| 11 | (CO)$_5$W=C(OCH$_3$)(C$_6$H$_5$) | HC≡C-C$_6$H$_4$-C≡CH (para) | HC≡C-C$_6$H$_5$ | 1/3 | 24,900 | 23.0 | 1/2 | — |
| 12 | (CO)$_5$W=C(OCH$_3$)(C$_6$H$_5$) | HC≡C-C$_6$H$_4$-C≡CH (para) | HC≡C-C$_6$H$_5$ | 3/1 | 28,200 | 19.5 | 4/1 | — |
| 13 | (CO)$_5$W=C(OCH$_3$)(C$_6$H$_5$) | HC≡C-C$_6$H$_4$-C≡CH (meta) | HC≡C-C$_6$H$_5$ | 1/1 | 24,400 | 41.0 | 2/1 | FIG. 3 |
| 14 | (CO)$_5$W=C(OCH$_3$)(C$_6$H$_5$) | HC≡C-C$_6$H$_4$-C≡CH (para) | Cl-C≡C-C$_6$H$_5$ | 1/1 | 25,600 | 22.5 | 2/3 | FIG. 4 |
| 15 | (CO)$_5$W=C(OCH$_3$)(C$_6$H$_5$) | HC≡C-C$_6$H$_4$-C≡CH (para) | HC≡C-C$_4$H$_9$ | 1/1 | 23,300 | 22.3 | 3/1 | FIG. 5 |

TABLE 3-continued

Results of Copolymerization

Figure 6:
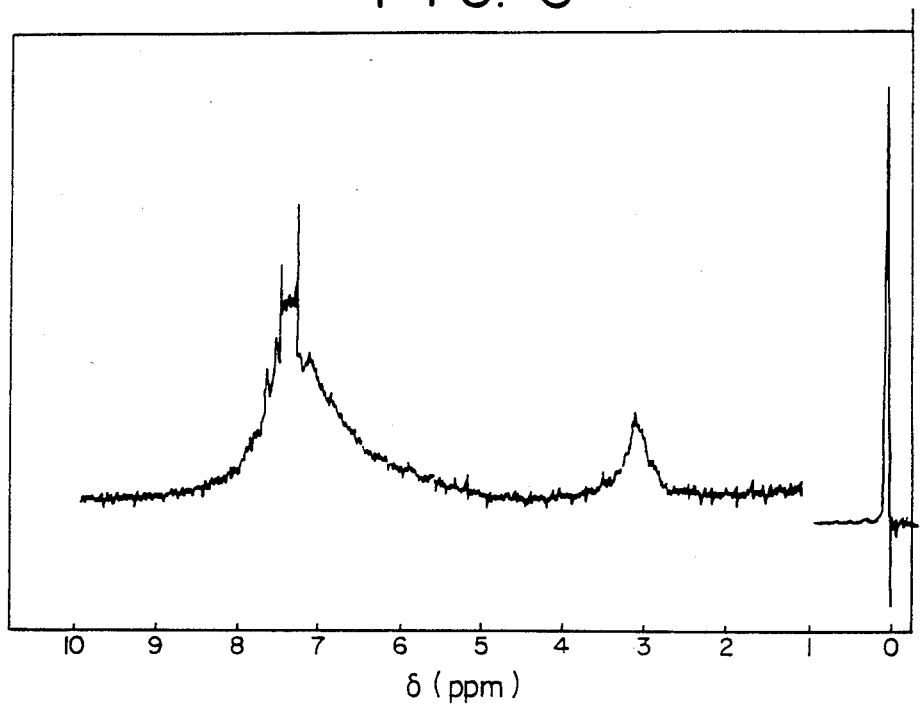
Figure 7:
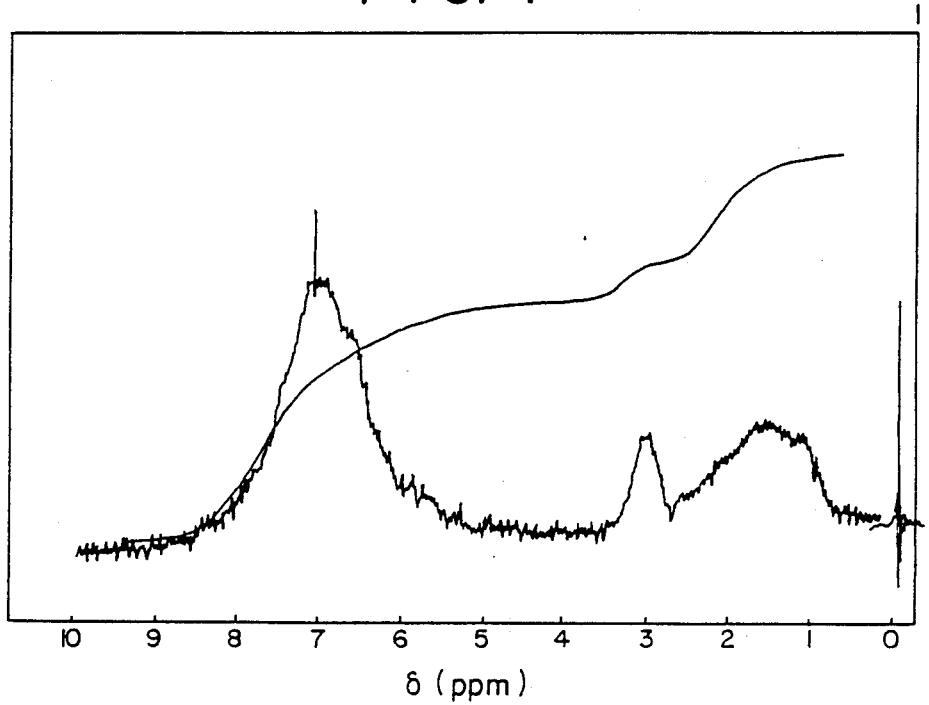
Figure 8:
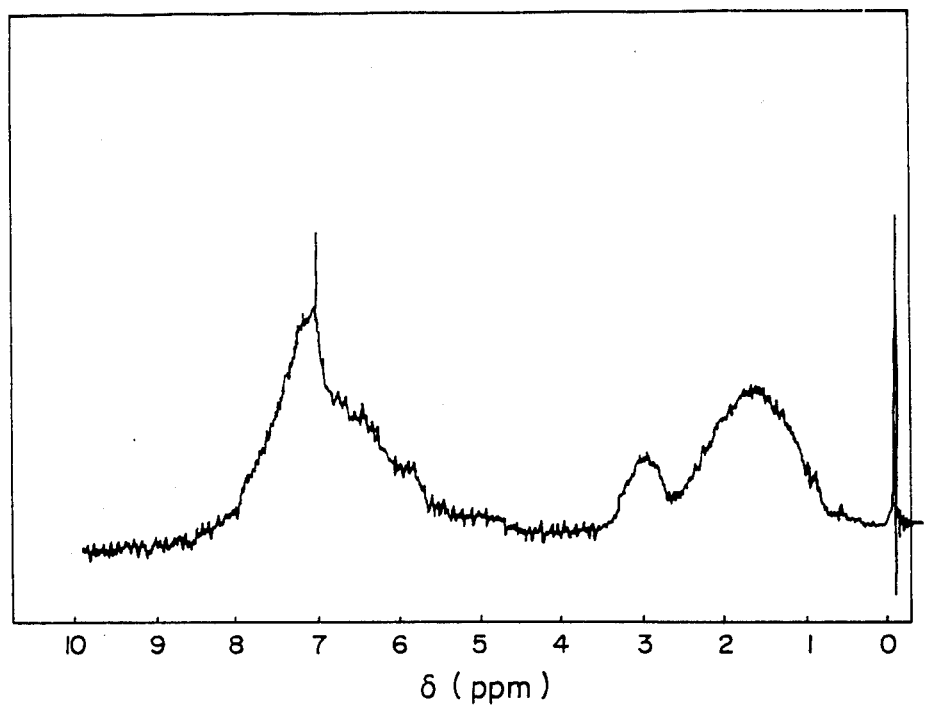

| Synthesis Example No. | Catalysts | Monomer A | Monomer B | A/B (Prepared Ratio) | Weight-average molecular weight | Yield (%) | A/B Composition Ratio in Copolymer | PMR Chart |
|---|---|---|---|---|---|---|---|---|
| 16 | (CO)₅W=C(OCH₃)(C₆H₅) | HC≡C-C₆H₄-C≡CH | 1-naphthyl-C≡CH | 1/1 | 26,000 | 20.5 | 3/1 | FIG. 6 |
| 17 | (CO)₅W=C(OCH₃)(C₆H₅) | HC≡C-C₆H₄-C≡CH | HC≡C-CH(CH₃)₂ | 1/1 | 24,100 | 21.0 | 3/1 | FIG. 7 |
| 18 | (CO)₅W=C(OCH₃)(C₆H₅) | HC≡C-C₆H₄-C≡CH | HC≡C-cyclohexyl | 1/1 | 22,000 | 23.0 | 3/1 | FIG. 8 |
| 19 | (CO)₅W=C(OCH₃)(C₆H₅) | HC≡C-C₆H₄-C≡CH | diphenylacetylene | 1/1 | 23,000 | 24.5 | 3/1 | |
| 20 | (CO)₅W=C(C₆H₅)(C₆H₅) | HC≡C-C₆H₄-C≡CH | HC≡C-C₆H₅ | 1/1 | 27,000 | 31.2 | 3/2 | |

TABLE 3-continued

Results of Copolymerization

| Synthesis Example No. | Catalysts | Monomer A | Monomer B | A/B (Prepared Ratio) | Weight-average molecular weight | Yield (%) | A/B Composition Ratio in Copolymer | PMR Chart |
|---|---|---|---|---|---|---|---|---|
| 21 | (CO)₅Mo=C(OCH₃)(C₆H₅) | 1,4-diethynylbenzene (HC≡C–C₆H₄–C≡CH) | phenylacetylene (HC≡C–C₆H₅) | 1/1 | 12,000 | 27.0 | 2/1 | |
| 22 | WCl₆ + HC≡C–C₆H₅ | 1,3-diethynylbenzene | CH₃–C≡C–Si(CH₃)₃ | 1/1 | 21,000 | 43.0 | 4/1 | |
| 23 | MoCl₅ + HC≡C–C₅H₁₁ | 1,3-diethynylbenzene | HC≡C–C₅H₁₁ | 1/1 | 11,000 | 22.3 | 1/2 | |
| 24 | NbCl₅ + HC≡C–C₆H₄–C≡C–C₆H₅ | 1,4-diethynylbenzene | diphenylacetylene (C₆H₅–C≡C–C₆H₅) | 1/1 | 8,500 | 10.5 | 1/4 | |
| 25 | TaCl₅ + CH₃–C≡C–Si(CH₃)₃ | 1,4-diethynylbenzene | CH₃–C≡C–Si(CH₃)₃ | 1/1 | 7,800 | 9.8 | 1/3 | |
| 26 | TaCl₅ + CH₃–C≡C–C₂H₅ | 1,4-diethynylbenzene | CH₃–C≡C–C₂H₅ | 1/1 | 4,200 | 11.3 | 1/4 | |

TABLE 4

Results of Copolymerization using Conventional Catalysts

| Synthesis Example No. | Catalysts | Monomer A | Monomer B | A/B (Prepared Ratio) | Weight-average molecular weight | Yield (%) | A/B Composition Ratio in Copolymer |
|---|---|---|---|---|---|---|---|
| 2 | $WCl_6$ | HC≡C—⟨⟩—C≡CH | HC≡C—⟨⟩ | 1/1 | 18,000 | 2.5 | 2/1 |
| 6 | $W(CO)_6$ Irradiation of a high pressure mercury lamp for 30 min. in $CCl_4$ | HC≡C—⟨⟩—C≡CH | HC≡C—⟨⟩ | 1/1 | 15,700 | 4.3 | 2/1 |
| 7 | $MoCl_5$ Irradiation of a high pressure mercury lamp for 30 min. in $CCl_4$ | HC≡C—⟨⟩—C≡CH | HC≡C—⟨⟩ | 1/1 | 8,200 | 2.2 | 2/1 |
| 8 | $MoCl_5$ | HC≡C—⟨⟩—C≡CH (meta) | HC≡C—⟨⟩ | 1/1 | 9,700 | 1.2 | 2/1 |
| 9 | $Ti(OC_4H_9)_4$ $Al(C_2H_5)_3$ | HC≡C—⟨⟩—C≡CH | HC≡C—⟨⟩ | 1/1 | 16,000 | 3.1 | 2/1 |

TABLE 5

Results of Film-forming

| Improvement agents for molding and casting property | Results |
|---|---|
| HC≡C—C₆H₄—C≡CH (1,3-diethynylbenzene) | The film was cracked after 2 hours' drying at 50° C. |
| anthracene | The film was cracked after 2 hours' drying at 50° C. |
| tetracene | The film was cracked after 2 hours' drying at 50° C. |
| biphenyl | The film was cracked after 2 hours' drying at 50° C. |
| 4,4'-bipyridine | The film was cracked after 2 hours' drying at 50° C. |
| p-terphenyl | The film was cracked after 2 hours' drying at 50° C. |
| diphenyl ether | The film was cracked after 3 hours' drying at 50° C. |

TABLE 5-continued

Results of Film-forming

| Improvement agents for molding and casting property | Results |
|---|---|
| 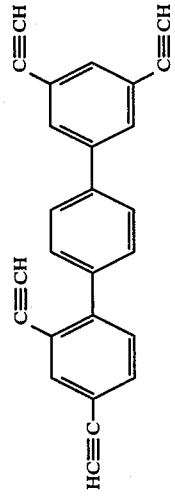 | The film was cracked after 3 hours' drying at 50° C. |
| 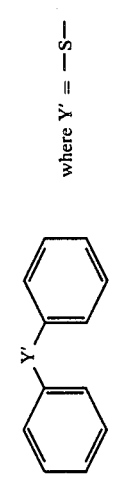 where Y' = —S— | The film was not cracked over 3 hours' drying at 50° C. |
| 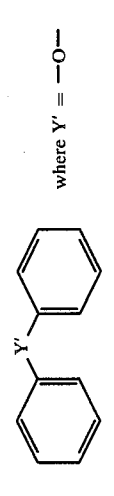 where Y' = —O— | The film was cracked after 2 hours' drying at 50° C. |
| 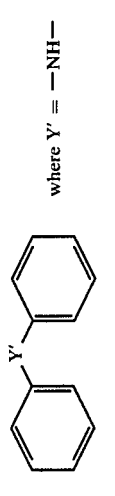 where Y' = —NH— | The film was cracked after 2 hours' drying at 50° C. |
| 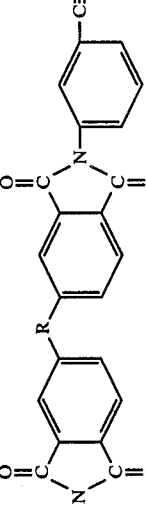 where R = —S— | The transparent, uniform film was obtained. The hardness of the lead was 4H or above. |
| 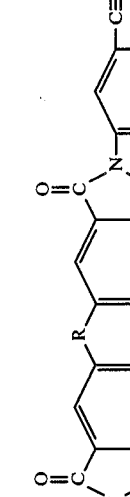 where R = C(CF$_3$)$_2$ | The transparent, uniform film was obtained. The hardness of the lead was 4H or above. |

TABLE 5-continued

| Results of Film-forming | |
|---|---|
| Improvement agents for molding and casting property | Results |
|  where R = —CF$_2$ | The transparent, uniform film was obtained. The hardness of the lead was 4H or above. |
|  where R = —O— | The transparent, uniform film was obtained. The hardness of the lead was 4H or above. |
|  where R = —SO$_2$— | The transparent, uniform film was obtained. The hardness of the lead was 4H or above. |
|  (THERMID MC-600) | The transparent, uniform film was obtained. The hardness of the lead was 4H or above. |
|  | The transparent, uniform film was obtained. The hardness of the lead was 4H or above. |

TABLE 5-continued

| Improvement agents for molding and casting property | Results of Film-forming Results |
|---|---|
|  where Ar = (tolyl) | The transparent, uniform film was obtained. The hardness of the lead was 4H or above. |
| 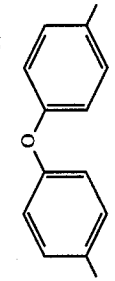 where Ar = (bis(tolyl) ether) | The transparent, uniform film was obtained. The hardness of the lead was 4H or above. |
| 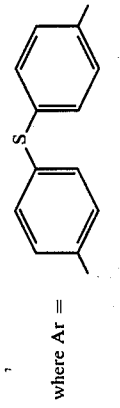 where Ar = (bis(tolyl) sulfide) | The transparent, uniform film was obtained. The hardness of the lead was 4H or above. |
| 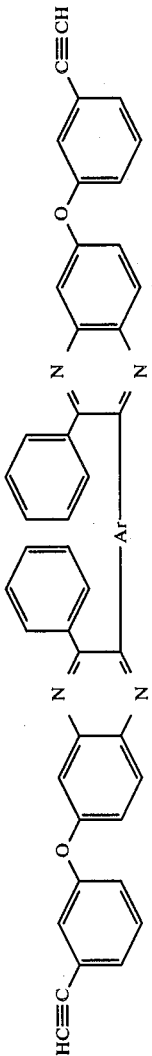 | The transparent, uniform film was obtained. The hardness of the lead was 4H or above. |

TABLE 5-continued

Results of Film-forming

| Improvement agents for molding and casting property | Results |
|---|---|
| (Example 41) Bis-azomethine oligomer with Ar = para-phenylene | The transparent, uniform film was obtained. The hardness of the lead was 4H or above. |
| (Example 42) Bis-azomethine oligomer with Ar = meta-phenylene, plus bis(4-methylphenoxy)-substituted variant | The transparent, uniform film was obtained. The hardness of the lead was 4H or above. |
| N,N'-bis(3-ethynylphenyl-methylene)-1,4-phenylenediamine | The transparent, uniform film was obtained. The hardness of the lead was 4H or above. |
| 1,3-bis(3-ethynylphenoxy)benzene derivative | The film was cracked after 2 hours' drying at 50° C. |

TABLE 5-continued

Results of Film-forming

| Improvement agents for molding and casting property | Results |
|---|---|
| HC≡C—⌬—O—⌬—R—⌬—O—⌬—C≡CH   where R = —CO— | The film was cracked after 2 hours' drying at 50° C. |
| HC≡C—⌬—O—⌬—R—⌬—O—⌬—C≡CH   where R = C(CF$_3$)$_2$ | The film was cracked after an hour's drying at 100° C. |
| HC≡C—⌬—O—⌬—R—⌬—O—⌬—C≡CH   where R = —S— | The film was cracked after an hour's drying at 100° C. |
| HS—⌬—SH | The film was cracked after 3 hours' drying at 50° C. |
| H$_2$N—⌬—NH$_2$ | The film was cracked after 3 hours' drying at 50° C. |
| HO—⌬—OH | The film was cracked after 3 hours' drying at 50° C. |
| Cl-, SH-, SH- substituted benzene | The film was cracked after 2 hours' drying at 50° C. |

TABLE 5-continued

Results of Film-forming

| Improvement agents for molding and casting property | Results |
|---|---|
| | The film was cracked after an hour's drying at 200° C. |
| (phthalate structure) —C(=O)—O—Q'₁ / —C(=O)—O—Q'₂ where Q'₁ = Q'₂ = CH₂CH₂CH₂CH₂CH₃ | The transparent, uniform film was formed. The hardness of the lead was 4H or above. |
| (phthalate structure) —C(=O)—O—Q'₁ / —C(=O)—O—Q'₂ where Q'₁ = Q'₂ = —CH₂—CH=CH₂ | The transparent, uniform film was formed. The hardness of the lead was 4H or above. |
| CH₂—O—COCH₃<br>\|<br>CH—O—COCH₃<br>\|<br>CH₂—O—COCH₃ | The transparent, uniform film was formed. The hardness of the lead was 4H or above. |
| CH₂—O—CO—C₃H₇<br>\|<br>CH—O—CO—C₃H₇<br>\|<br>CH₂—O—CO—C₃H₇ | |

TABLE 7
Photocrosslinking Initiators in Synthesis Example 31
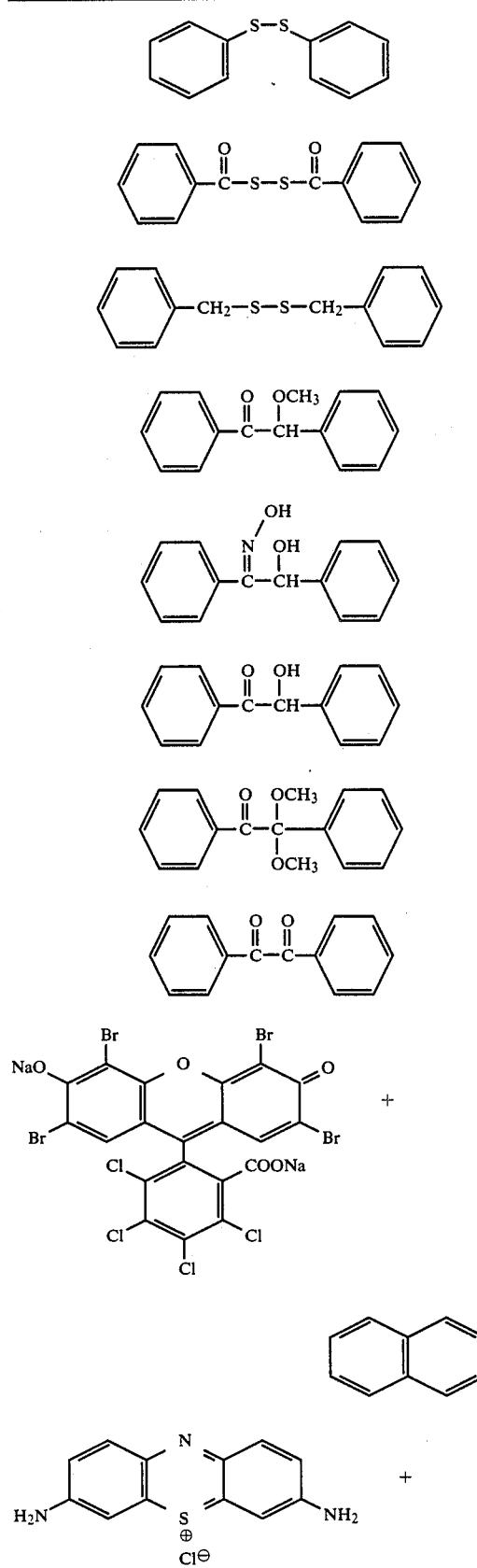
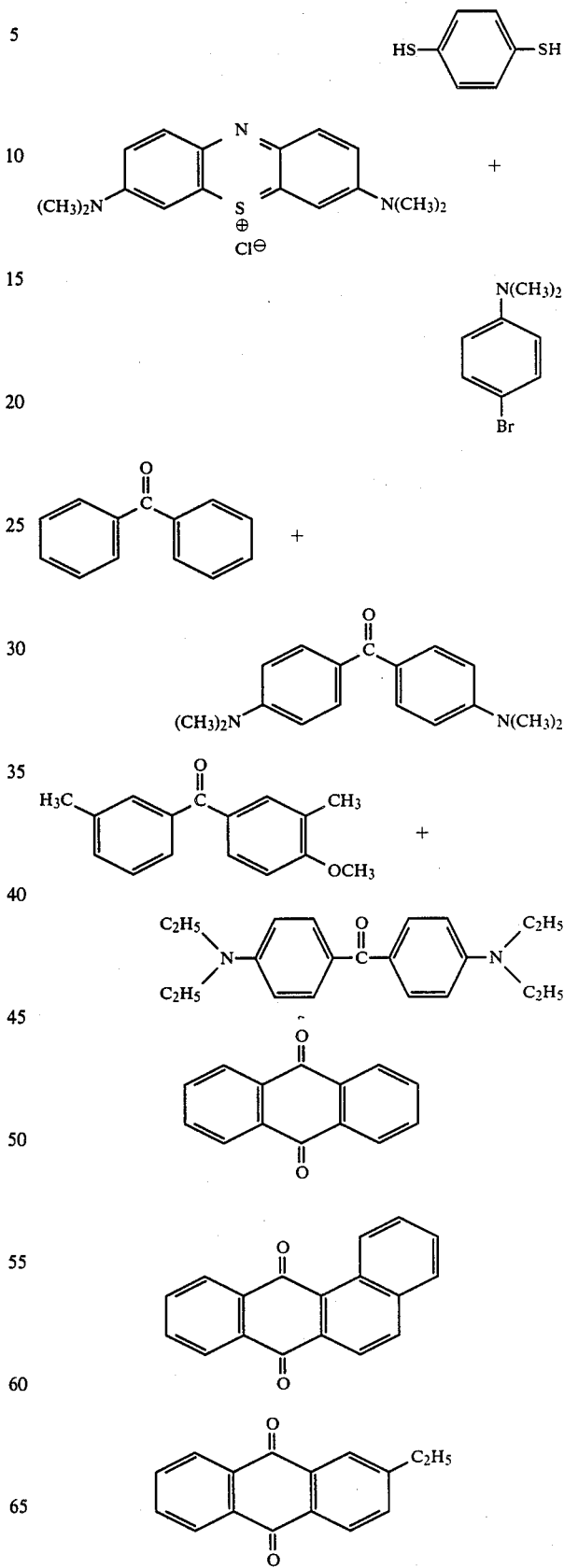

TABLE 7-continued

Photocrosslinking Initiators in Synthesis Example 31

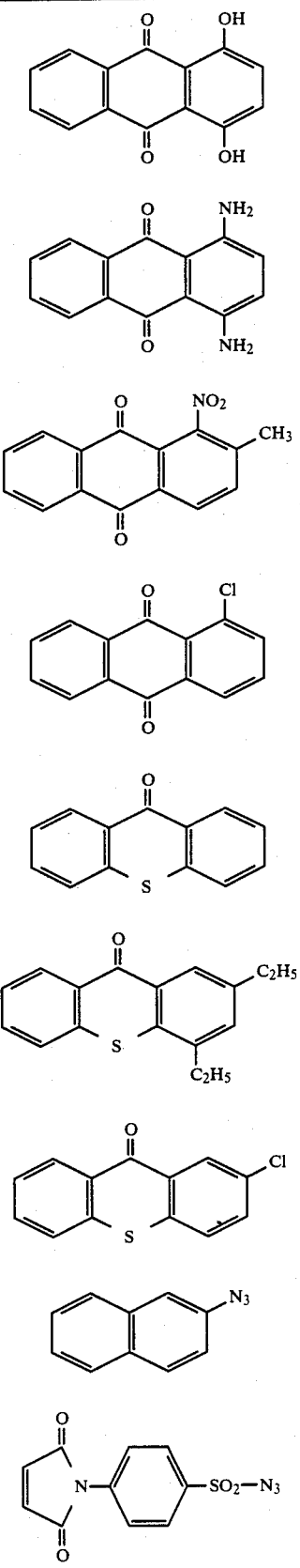

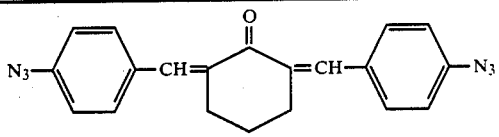

What is claimed is:

1. A resin composition consisting essentially of (i) a linear polymer having a recurring unit represented by the formula (I):

$$-CH=C- \quad \text{(I)}$$

(with $R_1 \sim R_4$ on phenyl ring and $C\equiv CH$ substituent)

wherein
R₁, R₂, R₃ and R₄ each independently is a hydrogen atom, a C₁₋₁₀ alkyl group, a C₆₋₁₀ cycloalkyl group, an aryl group, or a halogen atom and the ethynyl group is in either meta position or para position to the main polymer chain; and a weight-average molecular weight of 1,000 to 1,000,000 or a linear copolymer having a weight-average molecular weight of 1,000 to 1,000,000 consisting of a recurring unit represented by the formula (I) and a recurring unit represented by the formula (II):

$$-\underset{X}{C}=\underset{Y}{C}- \quad \text{(II)}$$

wherein
X and Y each independently is a C₆₋₂₀ aryl group, a C₁₋₁₀ alkyl group, a C₆₋₁₀ cycloalkyl group, a silyl group having a C₁₋₁₀ alkyl group or a C₆₋₁₀ aryl group, a hydrogen atom or a halogen atom, and the ethynyl group of the unit (I) is in either meta position or para position to the main polymer chain; and the weight ratio of the unit (I) to the unit (II) ranges from 1/99 to 99.5/0.5 and (ii) at least one agent selected from the group consisting of (a) an improvement agent for casting and molding property in an amount of about 3 to about 50 % by weight based on the weight of the polymer; (b) an adhesive agent in an amount of about 1 to about 5 % by weight based on the weight of the polymer, and (c) a photocrosslinking initiator in an amount of about 0.1 to about 20 % by weight baed on the weight based on the weight of the polymer.

2. The resin oomposition according to claim 1, wherein the improvement agent for casting and molding property is a compound of the formula (III)

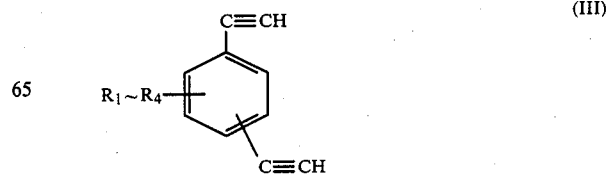

wherein R₁, R₂, R₃ and R₄ each independently is a hydrogen atom, a $C_{1-10}$ alkyl group, a $C_{6-10}$ cycloalkyl group, an aryl group, or a halogen atom and the ethynyl group is in either meta position or para position to the other ethynyl group.

3. The resin composition according to claim 2, wherein the compound is diethynylbenzene.

4. The resin composition according to claim 1, wherein the improvement agent for casting and molding property is at least one organic aromatic compound having at least two 6-membered aromatic rings which are condensed with each other, directly bonded to each other or bonded to each other through one oxygen atom, one sulfur atom, one nitrogen atom, one phosphorus atom, a methylene group, a dimethylmethylene group, an ethylene group, a vinylene group, or a keto group.

5. The resin composition according to claim 4, wherein the aromatic compound is branched polyphenylene having at least two ethynyl groups.

6. The resin composition according to claim 4, wherein the aromatic compound has the formula (VIII):

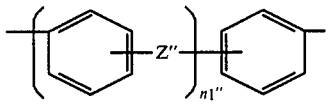

(VIII)

wherein

Y' is —S—, —O—, —NH—, or —SO₂—.

7. The resin composition according to claim 1, wherein the improvement agent for casting and molding property is, an aromatic polyimide compound having a weight-average molecular weight is not more than 10,000 and preferably not more than 5,000.

8. The resin composition according to claim 7, wherein the aromatic polyimide compound has an ethynyl group and is represented by the formula (IX):

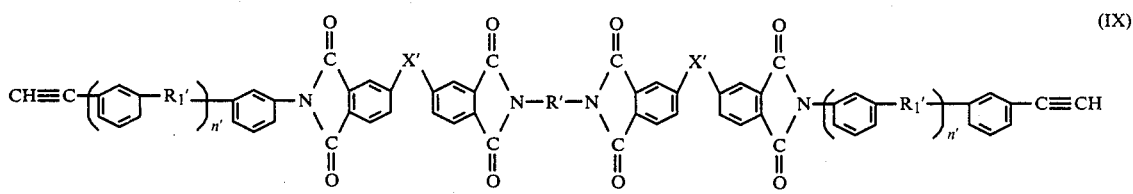

(IX)

wherein

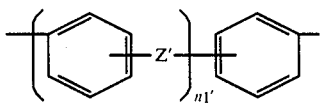

R' is (wherein Z' is —O—, —S—, —CO—, —SO₂—, —C(CF₃)₂— or —CF₂— and $n_1'$ is an integer of 0 to 5), $R_1'$ and X' each independently is —O—, —S—, —CO—, —SO₂—, —C(CF₃)₂—, or —CF₂— and n' is an integer of 0 to 5).

9. The resin composition according to claim 1, wherein the improvement agent for casting and molding property is an aromatic polyamide ester compound having a weight-average molecular weight is not more than 10,000 and preferably not more than 5,000.

10. The resin composition according to claim 9, wherein the aromatic polyamide ester compound has the formula (X):

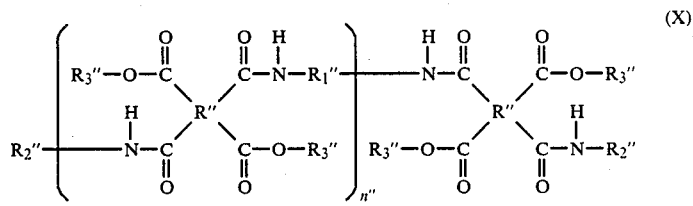

(X)

wherein

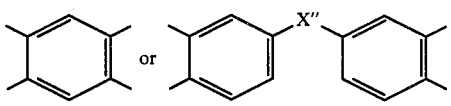

R" is (wherein X" is —O—, —S—, —CO—, —SO₂—, —C(CF₃)₂—, or —CF₂—), $R_1''$

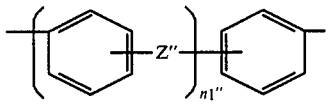

is (wherein Z" is —O—, —S—, —CO—, —SO₂—, —C(CF₃)₂— or —CF₂— and $n_1''$ is an integer of 0 to 5), $R_2''$ has the same meaning as $R_1''$ or the ethynyl group substituent thereof, $R_3''$ is a $C_{1-10}$ alkyl group, a $C_{6-10}$ aryl group, a $C_{6-10}$ cycloalkyl group or a $C_{2-10}$ hydrocarbon having at least one ethylenically double bond, and n" is an integer of 0 to 10.

11. The resin composition according to claim 1, wherein the improvement agent for casting and molding property is a quinoxaline compound having the formula (XI):

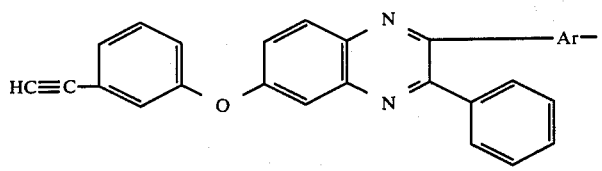

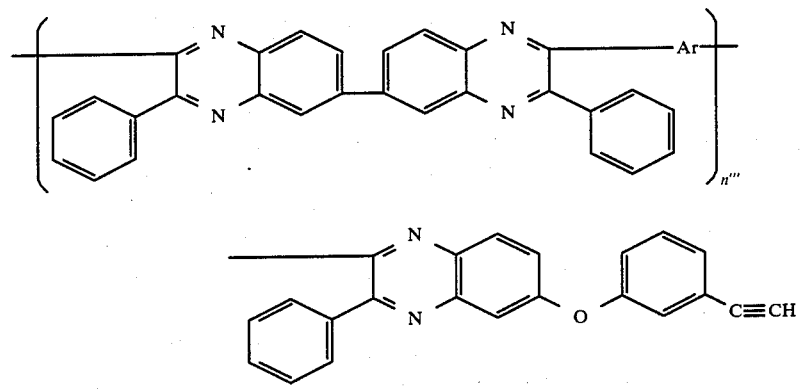

wherein
Ar is

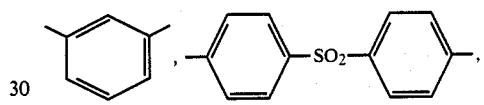

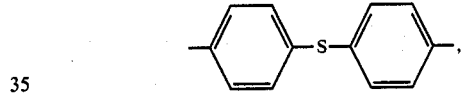

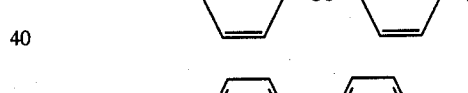, or 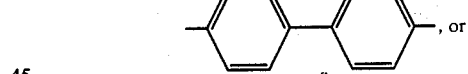

and n''' is 0 or 1.

12. The resin composition according to claim 1, wherein the improvement agent for casting and molding property is a compound having the formula (XII):

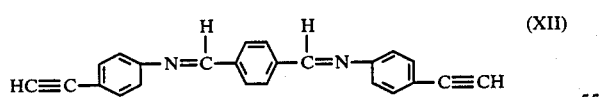

(XII)

13. The resin composition according to claim 1, wherein the improvement agent for casting and molding property is a compound having the formula (XIII):

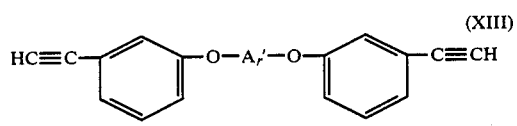

(XIII)

wherein
Ar' is

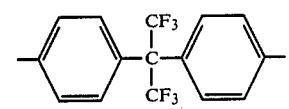

14. The resin composition according to claim 1, wherein the improvement agent for casting and molding property is a compound having the formula (XIV):

(XIV)

wherein
Y" is —SH, —NH$_2$, or —OH and X''' is a hydrogen atom or a chlorine atom.

15. The resin composition according to claim 1, wherein the improvement agent for casting and molding property is a phthalic acid ester derivative having the formula (XV):

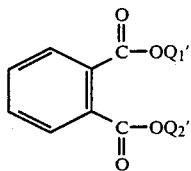
(XV)

wherein $Q_1'$ and $Q_2'$ each independently is a $C_{1-10}$ alkyl group or an allyl group.

16. The resin composition according to claim 1, wherein the improvement agent for casting and molding property is a triglyceride having the formula (XVI):

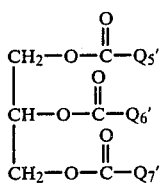
(XVI)

wherein $Q_5'$, $Q_6'$ and $Q_7'$ each independently is a $C_{1-10}$ alkyl group.

17. The resin composition according to claim 1, wherein the adhesive agent is an organo silicone compound having the formula (XVII):

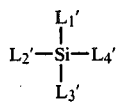
(XVII)

wherein $L_1'$, $L_2'$, $L_3'$, and $L_4'$ each independently is a $C_{1-10}$ alkyl group, a $C_{1-10}$ alkoxy group, a phenyl group, an acryl group- or methacryl group-substituted $C_{0-5}$ aliphatic hydrocarbon, a $C_{2-5}$ alkenyl group, a $C_{2-5}$ alkenyloxy group, a $C_{2-5}$ alkynyl group, or a $C_{2-5}$ alkynyloxy group, and at least one of $L_1'$, $L_2'$, $L_3'$ or $L_4'$ has C—C double bond or C—C triple bond.

18. The resin composition according to claim 1, wherein the photocrosslinking initiator is a compound producing a radical under light having a wave length of 300 to 500 nm.

19. The resin composition according to claim 18, wherein the compound is a disulfide having the formula (XVIII):

$A_r''$—S—S—$A_r''$ (XVIII)

wherein $A_r''$ is

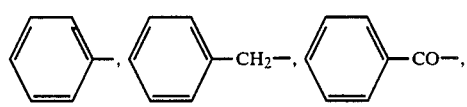

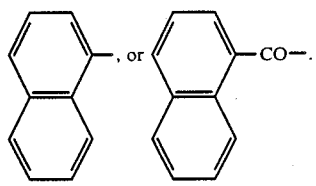

20. The resin composition according to claim 18, wherein the compound is a benzoine compound having the formula (XIX):

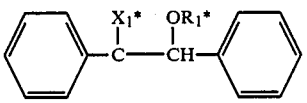
(XIX)

wherein $X_1^*$ is =O or =N—OH and $R_1^*$ is —H, or —CH$_3$.

21. The resin composition according to claim 18, wherein the compound is a benzil compound having the formula (XX):

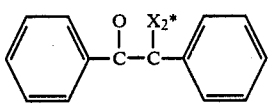
(XX)

wherein

—OCH$_3$.
—OCH$_3$ $X_2^*$ is =O or —OCH$_3$ —OCH$_3$ .

22. The resin composition according to claim 1, wherein the photocrosslinking initiator consists of (i) a compound which can excite under light having a wave length of 300 to 500 nm and (ii) a compound producing a radical by reacting with the excited compound.

23. The resin composition according to claim 22, wherein the compound (i) is a fluorescein having the formula (XXI):

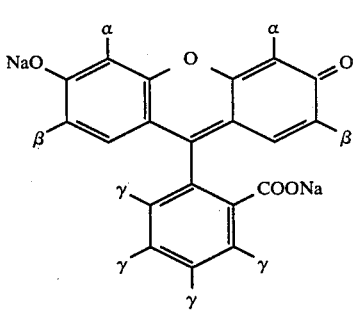
(XXI)

wherein $\alpha$ is a bromine atom or an iodine atom, $\beta$ is a bromine atom, an iodine atom or a nitro group, and $\gamma$ is a chlorine atom, or a hydrogen atom;

and the compound (ii) has the formula (XXII):

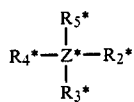 (XXII)

wherein

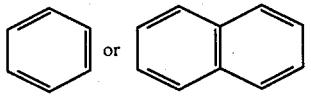

Z* is

R$_2$* is —OH, —SH, —NH$_2$, or —H, R$_3$* and R$_4$* each independently is —H or a halogen atom, R$_5$* is —OH, —SH, or —NH$_2$, and R$_2$*, R$_3$*, R$_4$*, and R$_5$* may be in any position in Z*.

24. The resin composition according to claim 22, wherein the compound (i) is a thiazine havinq the formula (XXIII):

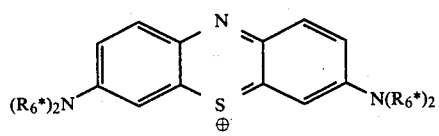 (XXIII)

wherein

R$_6$* is a hydrogen atom or a methyl group;

and the compound (ii) is the compound of the formula (XXII) defined in claim 23.

25. The resin composition according to claim 22, wherein the compound (i) is a diaminobenzophenone compound having the formula (XXIV):

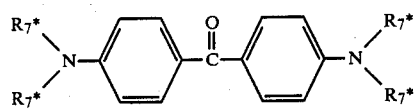 (XXIV)

wherein

R$_7$* is a methyl group or an ethyl group;

and the compound (ii) is a benzophenone compound having the formula (XXV):

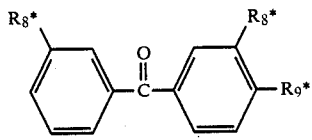 (XXV)

wherein

R$_8$* is a hydrogen atom or a methyl group and R$_9$* is a hydrogen atom or a methoxy group.

26. The resin composition according to claim 1, wherein the photocrosslinking initiator is a compound extracting a hydrogen atom from the ethynyl group contained in the recurring unit of the formula (I) to produce an acetylene radical under light having a wave length of 300 to 500 nm.

27. The resin composition according to claim 26, wherein the compound is 1,2-benzanthraquinone or an anthraquinone compound having the formula (XXVI):

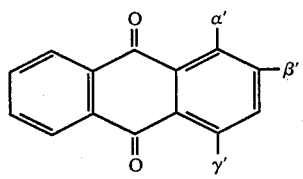 (XXVI)

wherein

α' is —H, —OH, —NH$_2$, —Cl, or —NO$_2$, β' is a methyl group, an ethyl group, a t-butyl group, a n-pentyl group, a chlorine atom or a hydrogen atom, and γ' is —H, —OH, or —NH$_2$.

28. The resin composition according to claim 26, wherein the compound is a thioxanthone compound having the formula (XXVII):

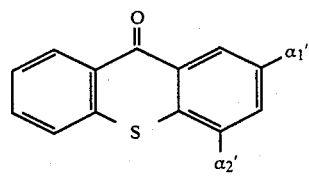 (XXVII)

wherein

α$_1$' is a hydrogen atom, a chlorine atom, an i-propyl group, or an ethyl group, and α$_2$' is a hydrogen atom, an ethyl group, or an i-propyl group.

29. The resin composition according to claim 1, wherein the photocrosslinking initiator is a compound selected from the group consisting of β-naphthylazide, N-(4-azidosulfonylphenyl)maleinimide and 2,6-bis(p-azidobenzylidene)cyclohexanone.

* * * * *